(12) United States Patent
Morita et al.

(10) Patent No.: US 12,164,038 B2
(45) Date of Patent: Dec. 10, 2024

(54) DISTANCE MEASURING DEVICE, VEHICLE-MOUNTED SYSTEM, AND DISTANCE MEASURING METHOD

(71) Applicant: SONY SEMICONDUCTOR SOLUTIONS CORPORATION, Kanagawa (JP)

(72) Inventors: Yousuke Morita, Kanagawa (JP); Koichi Hasegawa, Kanagawa (JP)

(73) Assignee: SONY SEMICONDUCTOR SOLUTIONS CORPORATION, Kanaawa (JP)

( * ) Notice: Subject to any disclaimer, the term of this patent is extended or adjusted under 35 U.S.C. 154(b) by 612 days.

(21) Appl. No.: 17/423,243

(22) PCT Filed: Jan. 17, 2020

(86) PCT No.: PCT/JP2020/001607
§ 371 (c)(1),
(2) Date: Jul. 15, 2021

(87) PCT Pub. No.: WO2020/153275
PCT Pub. Date: Jul. 30, 2020

(65) Prior Publication Data
US 2022/0066038 A1 Mar. 3, 2022

(30) Foreign Application Priority Data
Jan. 24, 2019 (JP) .................................. 2019-010563

(51) Int. Cl.
*G01S 17/931* (2020.01)
*G01S 7/481* (2006.01)
(Continued)

(52) U.S. Cl.
CPC .......... *G01S 17/931* (2020.01); *G01S 7/4816* (2013.01); *G01S 17/10* (2013.01); *G01S 17/89* (2013.01); *H01L 31/107* (2013.01)

(58) Field of Classification Search
CPC ...... G01S 17/931; G01S 7/4816; G01S 17/10; G01S 17/89; H01L 31/107
(Continued)

(56) References Cited

U.S. PATENT DOCUMENTS 9,958,379 B1 * 5/2018 Zhu .......................... G01S 17/08
10,133,280 B2 * 11/2018 Kim ....................... G08G 1/163
(Continued)

FOREIGN PATENT DOCUMENTS

| CN | 110268283 A | 9/2019 |
| CN | 110312945 A | 10/2019 |

(Continued)

OTHER PUBLICATIONS

International Search Report and Written Opinion of PCT Application No. PCT/JP2020/001607, issued on Mar. 24, 2020, 11 pages of ISRWO.

*Primary Examiner* — Nuzhat Pervin
(74) *Attorney, Agent, or Firm* — CHIP LAW GROUP

(57) ABSTRACT

Reduction in distance measurement accuracy is decreased. A distance measuring device according to embodiments includes an array (142) in which a plurality of light-receiving elements each configured to detect incidence of a photon are arranged, a read circuit (22) configured to read a detection signal from each of the light-receiving elements, and a plurality of computing units (15-1 to 15-4) configured to generate depth information on a distance to an object present in an angle of view in different regions in the array, based on the detection signals read from the light-receiving elements belonging to the different regions. The computing units
(Continued)

generate the depth information using computation coefficients (16-1 to 16-4) at least partially different from each other.

17 Claims, 25 Drawing Sheets

(51) Int. Cl.
  *G01S 17/10* (2020.01)
  *G01S 17/89* (2020.01)
  *H01L 31/107* (2006.01)
(58) Field of Classification Search
  USPC .......................................................... 342/70
  See application file for complete search history.

(56) References Cited

U.S. PATENT DOCUMENTS

| | | | |
|---|---|---|---|
| 10,133,947 B2* | 11/2018 | Yang | G06V 40/103 |
| 10,277,007 B1* | 4/2019 | Lenius | G01S 17/06 |
| 10,410,250 B2* | 9/2019 | Singhal | G01C 21/3407 |
| 10,761,196 B2* | 9/2020 | Dussan | G01S 7/4813 |
| 10,984,257 B2* | 4/2021 | England | G06T 7/50 |
| 11,516,417 B2* | 11/2022 | Oike | H04N 25/75 |
| 11,520,050 B2* | 12/2022 | Iguchi | G01S 7/4813 |
| 11,719,788 B2* | 8/2023 | Motoyama | G01C 3/08 |
| | | | 342/55 |
| 11,821,990 B2* | 11/2023 | Chen | G01S 13/865 |
| 2009/0134396 A1* | 5/2009 | Kawahito | H01L 27/14643 |
| | | | 257/225 |
| 2009/0230437 A1* | 9/2009 | Kawahito | H01L 27/14603 |
| | | | 257/E27.15 |
| 2011/0098970 A1* | 4/2011 | Hug | G01F 23/292 |
| | | | 702/158 |
| 2013/0088620 A1* | 4/2013 | Centen | H04N 23/12 |
| | | | 348/308 |
| 2015/0153452 A1* | 6/2015 | Yamamoto | G01S 7/4865 |
| | | | 356/5.01 |
| 2017/0357737 A1* | 12/2017 | Li | G06F 30/00 |
| 2018/0259645 A1* | 9/2018 | Shu | G01S 7/4865 |
| 2018/0299552 A1 | 10/2018 | Shu et al. | |
| 2018/0307944 A1* | 10/2018 | Li | G01S 7/4802 |
| 2018/0364340 A1* | 12/2018 | Ichiyanagi | G01S 7/4814 |
| 2019/0056497 A1* | 2/2019 | Pacala | G01S 7/4816 |
| 2019/0271767 A1* | 9/2019 | Keilaf | G01S 17/931 |
| 2020/0064451 A1* | 2/2020 | Matsui | G01S 7/4816 |
| 2020/0174122 A1* | 6/2020 | Kimura | H01L 31/107 |
| 2020/0284883 A1* | 9/2020 | Ferreira | H04N 25/773 |
| 2020/0379111 A1* | 12/2020 | Kimura | G01S 17/10 |
| 2021/0011154 A1* | 1/2021 | Smits | G01S 7/484 |
| 2021/0018623 A1* | 1/2021 | Yang | G01S 17/89 |
| 2021/0088663 A1* | 3/2021 | Rinnai | G01S 7/484 |
| 2023/0121373 A1* | 4/2023 | Steinberg | G01S 17/931 |
| | | | 356/5.01 |

FOREIGN PATENT DOCUMENTS

| | | | | |
|---|---|---|---|---|
| CN | 110537124 A | | 12/2019 | |
| EP | 2315045 A1 | | 4/2011 | |
| EP | 2820632 B1 | * | 5/2017 | ............ G01S 17/58 |
| EP | 3370048 A1 | * | 9/2018 | ................ G01J 1/02 |
| JP | 2011089986 A | * | 5/2011 | .......... G01F 23/284 |
| JP | 5901004 B2 | | 4/2016 | |
| JP | 2016-533140 A | | 10/2016 | |
| JP | 2020-504291 A | | 2/2020 | |
| JP | 2020-504299 A | | 2/2020 | |
| WO | WO-2018091970 A1 | * | 5/2018 | .......... G01S 17/931 |
| WO | WO-2018122560 A1 | * | 7/2018 | ................ G01J 3/44 |
| WO | 2018/160886 A1 | | 9/2018 | |
| WO | WO-2020009011 A1 | * | 1/2020 | ........... G01S 17/894 |

\* cited by examiner

DISTANCE MEASURING DEVICE, VEHICLE-MOUNTED SYSTEM, AND DISTANCE MEASURING METHOD

CROSS REFERENCE TO RELATED APPLICATIONS

This application is a U.S. National Phase of International Patent Application No. PCT/JP2020/001607 filed on Jan. 17, 2020, which claims priority benefit of Japanese Patent Application No. JP 2019-010563 filed in the Japan Patent Office on Jan. 24, 2019. Each of the above-referenced applications is hereby incorporated herein by reference in its entirety.

The present disclosure relates to a distance measuring device, a vehicle-mounted system, and a distance measuring method.

BACKGROUND

Distance image sensors (hereinafter referred to as ToF sensors) that perform distance measurement by time of flight (ToF) methods have recently attracted attention. For example, ToF sensors measure the distance to an object using a plurality of single-photon avalanche diodes (SPADs) arranged in two dimensions, which are fabricated using complementary metal oxide semiconductor (CMOS) semiconductor integrated circuit techniques.

In a ToF sensor using SPADs, the time (hereinafter referred to as the time of flight) taken from light emission from a light source to incidence of reflected light (hereinafter referred to as echo) on the SPADs is measured as a physical quantity multiple times, and the distance to an object is determined based on a histogram of the physical quantity generated from the measurement result.

CITATION LIST

Patent Literature

Patent Literature 1: Japanese Unexamined Patent Application Publication (Translation of PCT Application) No. 2016-533140

SUMMARY

Technical Problem

In a ToF sensor that acquires the light quantity of echo from an object as a histogram for each time of flight, optimum computation coefficients used in a computation process of calculating the distance to an object vary according to the distance to an object. For example, when an object is at a short distance, a high threshold is preferable as a threshold for extracting an echo component from the detected light. When an object is at a long distance, a low threshold is preferable. When an object is at a short distance, noise components are low frequencies, and when an object is at a long distance, noise components are high frequencies. It is therefore preferable that a filter coefficient for removing a low frequency component is set when an object is at a short distance, and a filter coefficient for removing a high frequency component is set when an object is at a long distance.

Conventionally, however, a computation process of calculating a distance is performed using the same computation coefficient irrespective of the distance to an object. This process may reduce distance measurement accuracy when an object at a short distance and an object at a long distance are present in a distance measurement range.

The present disclosure then proposes a distance measuring device, a vehicle-mounted system, and a distance measuring method capable of decreasing reduction in distance measurement accuracy.

Solution to Problem

To solve the above-described problem, a distance measuring device according to one aspect of the present disclosure comprises: an array in which a plurality of light-receiving elements are arranged, each of the light-receiving elements being configured to detect incidence of a photon; a read circuit configured to read a detection signal from each of the light-receiving elements; and a plurality of computing units configured to generate depth information on a distance to an object present in an angle of view in different regions in the array, based on the detection signals read from the light-receiving elements belonging to the different regions, wherein the computing units generate the depth information using computation coefficients at least partially different from each other.

DESCRIPTION OF EMBODIMENTS

Embodiments of the present disclosure will be described in detail below in conjunction with the drawings. In the following embodiments, the same part is denoted by the same reference sign and will not be further elaborated.

The present disclosure will be described in the order of items below.

1. First Embodiment
   1.1 Distance Measuring Device (ToF Sensor)
   1.2 Optical System
   1.3 Light-Receiving Unit
   1.4 Use SPAD Array
   1.5 SPAD Pixel
   1.6 Overall Operation Example of SPAD Pixel
   1.7 SPAD Adder
   1.8 Sampling Period
   1.9 Depth Image
   1.10 Histogram
   1.11 Problem of Common Computation Coefficient
   1.12 Computation Process According to First Embodiment
   1.13 Examples of Computation Coefficients
   1.14 Overall Configuration Example of Computing Unit
   1.15 Setting of Computation Coefficient in Register Block
   1.16 Chip Configuration Example of Light-Receiving Unit and Computing Unit
   1.17 Two-Dimensional Layout Example of Chip
   1.18 Operation and Effects
2. Second Embodiment
   2.1 Overall Configuration Example of Computing Unit
   2.2 Two-Dimensional Layout Example of Circuit Chip
   2.3 Operation and Effects
3. Third Embodiment
   3.1 Overall Configuration Example of Computing Unit
   3.2 Two-Dimensional Layout Example of Circuit Chip
   3.3 Operation and Effects
4. Fourth Embodiment
   4.1 First Example
   4.2 Second Example
   4.3 Third Example
   4.4 Operation and Effects
5. Fifth Embodiment
   5.1 Vehicle-Mounted System
   5.2 Computation Coefficient Switching Operation
   5.3 Operation and Effects
6. Application Examples 1. First Embodiment First of all, a first embodiment will be described in detail below with reference to the drawings.

1.1 Distance Measuring Device (ToF Sensor)

Figure 1:
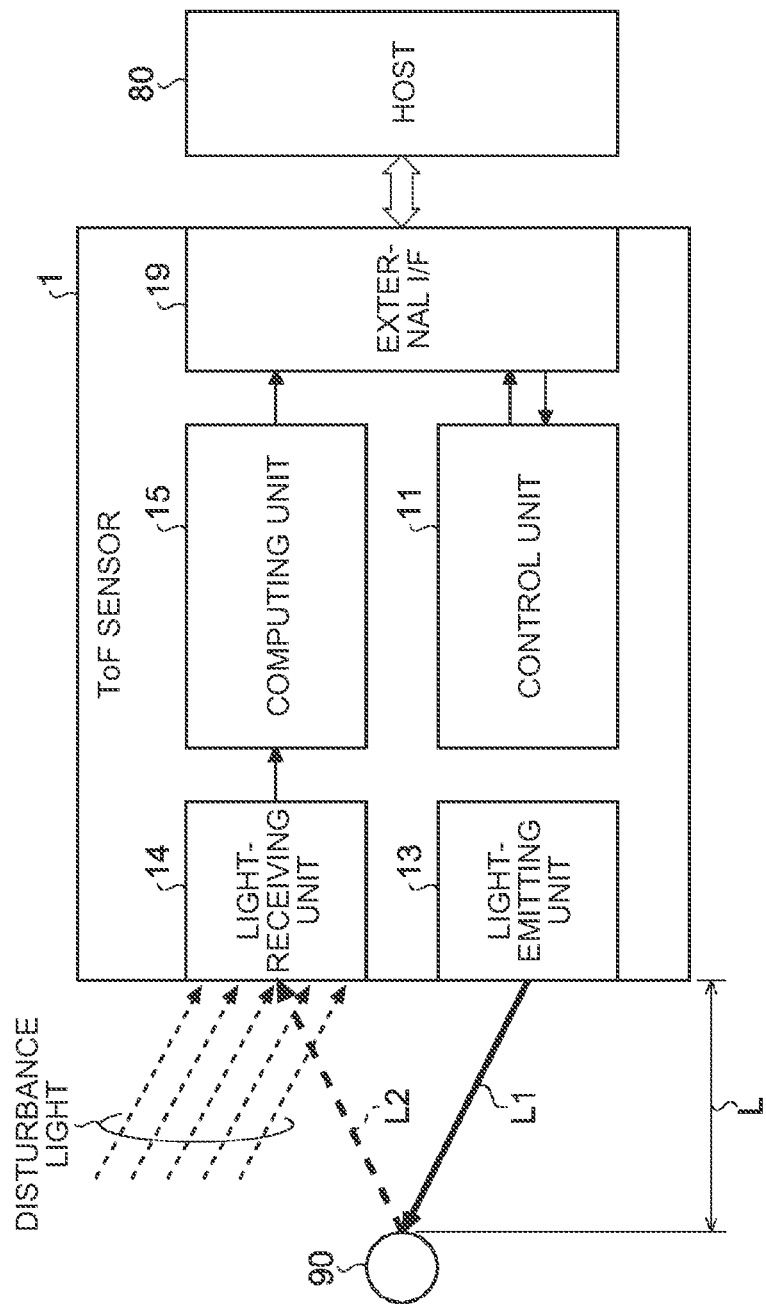
FIG. 1 is a block diagram illustrating an overall configuration example of a ToF sensor as a distance measuring device according to a first embodiment.

FIG. 1 is a block diagram illustrating an overall configuration example of a ToF sensor as a distance measuring device according to the present embodiment. As illustrated in FIG. 1, a ToF sensor 1 includes a control unit 11, a light-emitting unit 13, a light-receiving unit 14, a computing unit 15, and an external interface (I/F) 19.

The control unit 11 is configured with, for example, an information processing device such as a central processing unit (CPU) and controls each of units in the ToF sensor 1.

The external I/F 19 may be, for example, a communication adaptor for establishing communication with an external host 80 through a wireless local area network (LAN) or a wired LAN, or a communication network compliant with any standards such as Controller Area Network (CAN), Local Interconnect Network (LIN), and FlexRay (registered trademark).

Here, the host 80 may be, for example, an engine control unit (ECU) mounted on an automobile when the ToF sensor 1 is implemented in an automobile. When the ToF sensor 1 is mounted on an autonomous moving body such as an autonomous movable robot such as a home pet robot, a robot vacuum cleaner, an unmanned aircraft, and a following transport robot, the host 80 may be a control device that controls the autonomous moving body.

The light-emitting unit 13 includes, for example, one or more semiconductor laser diodes as a light source and emits pulsed laser light L1 with a predetermined time duration at predetermined intervals (also referred to as emission intervals). The light-emitting unit 13 emits laser light L1 with a time duration of 1 ns (nanosecond) at 1 MHz (megahertz). For example, when an object 90 is present in a distance measurement range, the laser light L1 emitted from the light-emitting unit 13 is reflected by the object 90 and incident as reflected light L2 on the light-receiving unit 14.

The light-receiving unit 14, which will be elaborated later, includes, for example, a plurality of SPAD pixels arranged in a two-dimensional grid and outputs information on the number of SPAD pixels (hereinafter referred to as detection number) that detect incidence of photons after emission by the light-emitting unit 13 (for example, equivalent to the number of detection signals described later). For example, the light-receiving unit 14 detects incidence of photons with a predetermined sampling period, for one emission by the light-emitting unit 13, and outputs the detection number.

The computing unit 15 aggregates the detection number output from the light-receiving unit 14 for each plurality of SPAD pixels (for example, corresponding to one or more macro-pixels described later) and constructs a histogram based on pixel values obtained by the aggregation, where the horizontal axis is the time of flight, and the vertical axis is the accumulated pixel value. For example, the computing unit 15 repeats aggregating the detection number at a predetermined sampling frequency for one emission by the light-emitting unit 13 to obtain a pixel value, for multiple emissions by the light-emitting unit 13, and constructs a histogram in which the horizontal axis (bins of the histogram) is the sampling period corresponding to the time of flight, and the vertical axis is the accumulated pixel value obtained by accumulating pixel values obtained in the sampling period.

The computing unit 15 performs a predetermined filter process for the constructed histogram and specifies the time of flight at which the accumulated pixel value is a peak, from the filtered histogram. The computing unit 15 then calculates the distance to the object 90 present within the distance measurement range from the ToF sensor 1 or a device equipped with the ToF sensor 1, based on the specified time of flight. Information on the distance calculated by the computing unit 15 may be, for example, output to the host 80 through the external I/F 19.

1.2 Optical System

Figure 2:
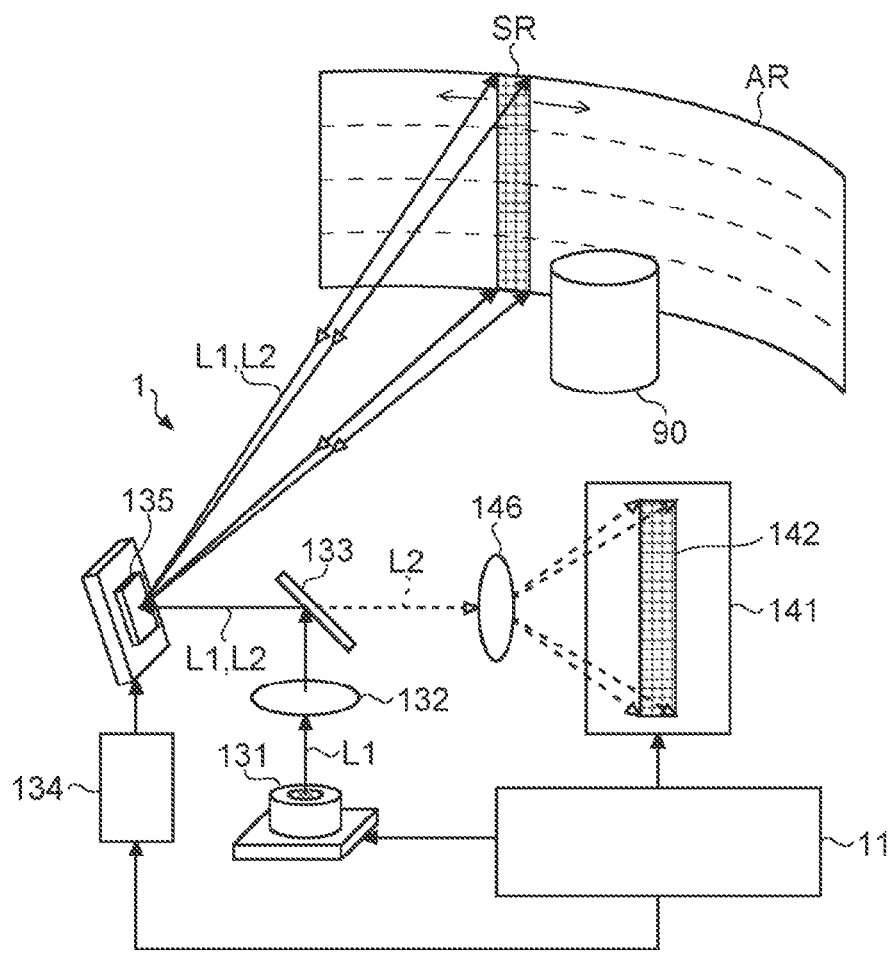
FIG. 2 is a diagram illustrating an optical system of the ToF sensor according to the first embodiment.

FIG. 2 is a diagram illustrating an optical system of the ToF sensor according to the present embodiment. FIG. 2 illustrates a scan-type optical system that scans the angle of view of the light-receiving unit 14 in a horizontal direction. However, the optical system is not limited thereto and, for example, a flash-type ToF sensor in which the angle of view of the light-receiving unit 14 is fixed may be employed.

As illustrated in FIG. 2, the ToF sensor 1 includes, as an optical system, a light source 131, a collimator lens 132, a half mirror 133, a galvano mirror 135, a light-receiving lens 146, and a SPAD array 141. The light source 131, the collimator lens 132, the half mirror 133, and the galvano mirror 135 are included in, for example, the light-emitting unit 13 in FIG. 1. The light-receiving lens 146 and the SPAD array 141 are included in, for example, the light-receiving unit 14 in FIG. 1.

In the configuration illustrated in FIG. 2, laser light L1 emitted from the light source 131 is converted by the collimator lens 132 into rectangular parallel light whose intensity spectrum in cross section is long in the vertical direction, and thereafter the laser light L1 is incident on the half mirror 133. The half mirror 133 reflects part of the incident laser light L1. The laser light L1 reflected by the half mirror 133 is incident on the galvano mirror 135. The galvano mirror 135, for example, is vibrated in the horizontal direction around a predetermined axis of rotation by a driver 134 operating under control of the control unit 11. The laser light L1 is thus horizontally scanned such that the angle of view SR of the laser light L1 reflected by the galvano mirror 135 reciprocatively scans a distance measurement range AR in the horizontal direction. For example, a micro-electro-mechanical system (MEMS) or a micromotor may be used for the driver 134.

The laser light L1 reflected by the galvano mirror 135 is reflected by the object 90 present in the distance measurement range AR and is incident on the galvano mirror 135 as reflected light L2. Part of the reflected light L2 incident on the galvano mirror 135 is transmitted through the half mirror 133 and incident on the light-receiving lens 146 to form an image on a certain use SPAD array 142 in the SPAD array 141. The use SPAD array 142 may be the whole or a part of the SPAD array 141.

1.3 Light-Receiving Unit

Figure 3:
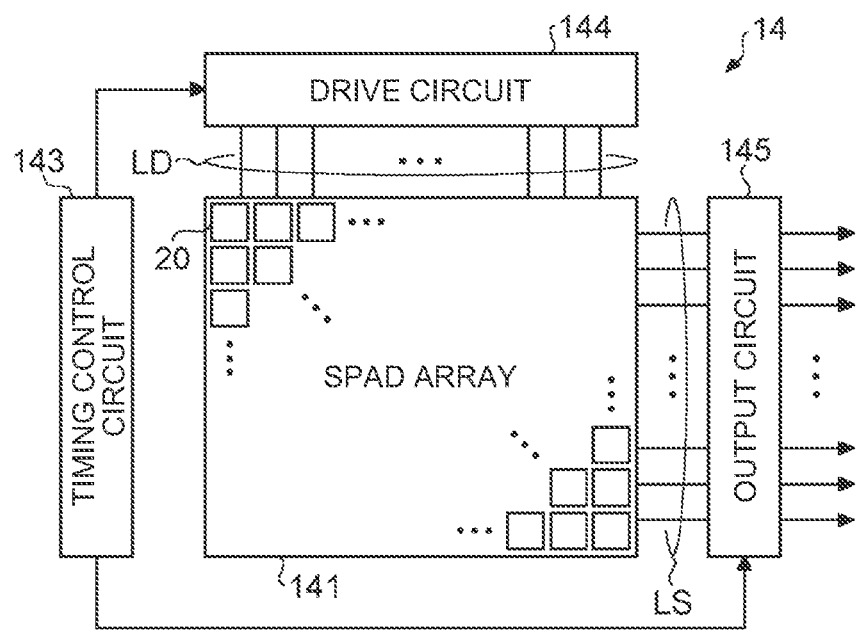
FIG. 3 is a block diagram illustrating an overall configuration example of a light-receiving unit according to the first embodiment.

FIG. 3 is a block diagram illustrating an overall configuration example of the light-receiving unit according to the present embodiment. As illustrated in FIG. 3, the light-receiving unit 14 includes the SPAD array 141, a timing control circuit 143, a drive circuit 144, and an output circuit 145.

The SPAD array 141 includes a plurality of SPAD pixels 20 arranged in a two-dimensional grid. For the SPAD pixels 20, a pixel drive line LD (the top-bottom direction in the figure) is connected for each column, and an output signal line LS (the right-left direction in the figure) is connected for each row. One end of the pixel drive line LD is connected to an output end corresponding to each column of the drive circuit 144, and one end of the output signal line LS is connected to an input end corresponding to each row of the output circuit 145.

In the present embodiment, the whole or a part of the SPAD array 141 is used to detect the reflected light L2. A region to be used in the SPAD array 141 (use SPAD array 142) may have a rectangular shape vertically long, which is the same as the image of the reflected light L2 formed on the SPAD array 141 when the entire laser light L1 is reflected as reflected light L2. However, the region to be used is not limited thereto and may be modified in various ways. For example, the region to be used may be a larger region or a smaller region than the image of the reflected light L2 formed on the SPAD array 141.

The drive circuit 144 includes a shift register, an address decoder, and the like and drives the SPAD pixels 20 in the SPAD array 141 all simultaneously or in units of columns. The drive circuit 144 at least includes a circuit to apply a quench voltage V_QCH described later to each SPAD pixel 20 in the selected column in the SPAD array 141 and a circuit to apply a select control voltage V_SEL described later to each SPAD pixel 20 in the selected column. The drive circuit 144 applies a select control voltage V_SEL to the pixel drive line LD corresponding to a read target column to select the SPAD pixels 20 to be used for detecting incidence of photons in units of columns.

A signal (referred to as detection signal) V_OUT output from each SPAD pixel 20 in the column selectively scanned by the drive circuit 144 is input to the output circuit 145 through the corresponding output signal line LS. The output circuit 145 outputs a detection signal V_OUT input from each SPAD pixel 20 to a SPAD adder 40 provided for each macro-pixel described later.

The timing control circuit 143 includes a timing generator for generating a variety of timing signals and controls the drive circuit 144 and the output circuit 145 based on a variety of timing signals generated by the timing generator.

1.4 Use SPAD Array

Figure 4:
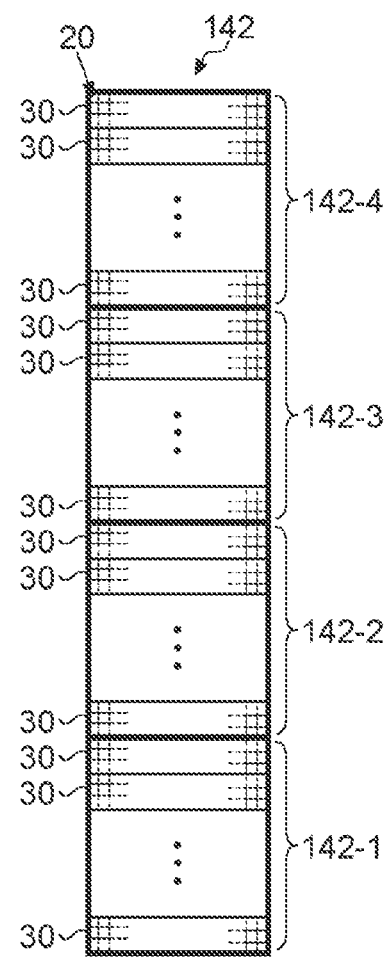
FIG. 4 is a diagram illustrating an overall configuration example of a use SPAD array according to the first embodiment.

FIG. 4 is a diagram illustrating an overall configuration example of the use SPAD array according to the present embodiment. As illustrated in FIG. 4, the use SPAD array 142 has a configuration, for example, in which a plurality of SPAD pixels 20 are arranged in a two-dimensional grid. The SPAD pixels 20 are grouped into a plurality of macro-pixels 30 each including a predetermined number of SPAD pixels 20 arranged in a row and/or column direction. A region formed by connecting the outside edges of SPAD pixels 20 located on the outermost perimeter of each macro-pixel 30 has a predetermined shape (for example, a rectangular shape).

The use SPAD array 142 is constituted with, for example, a plurality of macro-pixels 30 arranged in the vertical direction (corresponding to the column direction). In the present embodiment, the use SPAD array 142 is divided, for example, into a plurality of regions (hereinafter referred to as SPAD regions) in the vertical direction. In the example illustrated in FIG. 4, the use SPAD array 142 is divided into four SPAD regions 142-1 to 142-4. The SPAD region 142-1 located at the bottom of the use SPAD array 142 corresponds to, for example, the lowest ¼ region in the angle of view SR, the upper SPAD region 142-2 corresponds to, for example, the ¼ region second from the bottom in the angle of view SR, the upper SPAD region 142-3 corresponds to, for example, the ¼ region third from the bottom in the angle of view SR, and the uppermost SPAD region 142-4 corresponds to, for example, the ¼ region at the top in the angle of view SR.

1.5 SPAD Pixel

Figure 5:
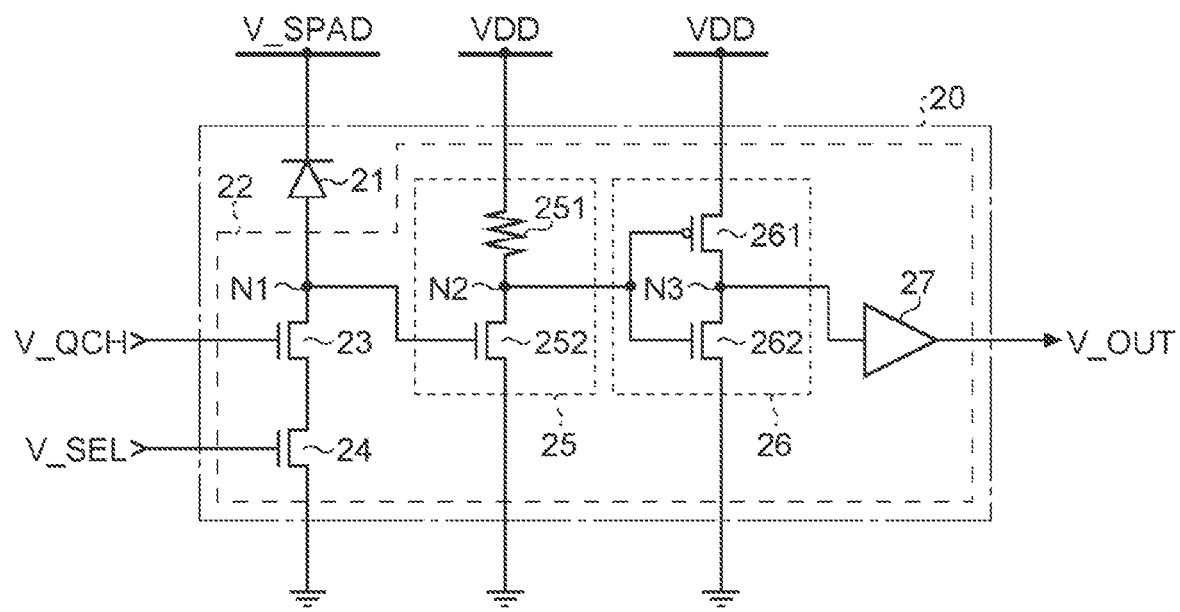
FIG. 5 is a circuit diagram illustrating an overall configuration example of a SPAD pixel according to the first embodiment.

FIG. 5 is a circuit diagram illustrating an overall configuration example of the SPAD pixel according to the present embodiment. As illustrated in FIG. 5, the SPAD pixel 20 includes a photodiode 21 as a light-receiving element and a read circuit 22 detecting incidence of a photon on the photodiode 21. The photodiode 21 generates avalanche current when a photon is incident in a state in which a reverse bias voltage V_SPAD equal to or higher than the breakdown voltage is applied between the anode and the cathode.

The read circuit 22 includes a quench resistor 23, a digital converter 25, an inverter 26, a buffer 27, and a select transistor 24. The quench resistor 23 is formed with, for example, an N-type metal oxide semiconductor field-effect transistor (MOSFET, which will be hereinafter referred to as NMOS transistor) having its drain connected to the anode of the photodiode 21 and its source grounded through the select transistor 24. A preset quench voltage V_QCH for allowing the NMOS transistor to act as a quench resistor is applied from the drive circuit 144 to the gate of the NMOS transistor forming the quench resistor 23 through the pixel drive line LD.

In the present embodiment, the photodiode 21 is a SPAD. The SPAD is an avalanche photodiode operating in a Geiger mode when a reverse bias voltage equal to or higher than the breakdown voltage is applied between the anode and the cathode, and can detect incidence of single photon.

The digital converter 25 includes a resistor 251 and an NMOS transistor 252. The NMOS transistor 252 has its drain connected to supply voltage VDD through the resistor 251 and its source grounded. A voltage at a connection point N1 between the anode of the photodiode 21 and the quench resistor 23 is applied to the gate of the NMOS transistor 252.

The inverter 26 includes a P-type MOSFET (hereinafter referred to as PMOS transistor) 261 and an NMOS transistor 262. The PMOS transistor 261 has its drain connected to supply voltage VDD and its source connected to the drain of the NMOS transistor 262. The NMOS transistor 262 has its drain connected to the source of the PMOS transistor 261 and its source grounded. A voltage at a connection point N2 between the resistor 251 and the drain of the NMOS transistor 252 is applied to each of the gate of the PMOS transistor 261 and the gate of the NMOS transistor 262. The output of the inverter 26 is input to the buffer 27.

The buffer 27 is a circuit for impedance conversion and receives an output signal from the inverter 26 to convert the impedance of the received output signal and output a detection signal V_OUT.

The select transistor 24 is, for example, an NMOS transistor having its drain connected to the source of the NMOS transistor forming the quench resistor 23 and its source grounded. The select transistor 24 is connected to the drive circuit 144 and changes from the off state to the on state when the select control voltage V_SEL from the drive circuit 144 is applied to the gate of the select transistor 24 through the pixel drive line LD.

1.6 Overall Operation Example of SPAD Pixel

The read circuit 22 illustrated in FIG. 5 operates as follows, for example. Specifically, first of all, the reverse bias voltage V_SPAD equal to or higher than the breakdown voltage is applied to the photodiode 21 in a period of time in which the select control voltage V_SEL is applied from the drive circuit 144 to the select transistor 24 to bring the select transistor 24 into the on state. The operation of the photodiode 21 is thus permitted.

On the other hand, in a period of time in which the select control voltage V_SEL is not applied from the drive circuit 144 to the select transistor 24 and the select transistor 24 is in the off state, the reverse bias voltage V_SPAD is not applied to the photodiode 21 and, therefore, the operation of the photodiode 21 is prohibited.

When a photon is incident on the photodiode 21 with the select transistor 24 in the on state, avalanche current is generated in the photodiode 21. The avalanche current then flows through the quench resistor 23, and the voltage at the connection point N1 rises. When the voltage at the connection point N1 becomes higher than the ON voltage of the NMOS transistor 252, the NMOS transistor 252 turns on, and the voltage at the connection point N2 changes from the supply voltage VDD to 0 V. Then, when the voltage at the connection point N2 changes from the supply voltage VDD to 0 V, the PMOS transistor 261 changes from the off state to the on state and the NMOS transistor 262 changes from the on state to the off state, and the voltage at a connection point N3 changes from 0 V to the supply voltage VDD. As a result, the detection signal V_OUT at high level is output from the buffer 27.

Subsequently, when the voltage at the connection point N1 keeps rising, the voltage applied between the anode and the cathode of the photodiode 21 becomes smaller than the breakdown voltage, so that the avalanche current stops and the voltage at the connection point N1 lowers. Then, when the voltage at the connection point N1 becomes lower than the ON voltage of the NMOS transistor 452, the NMOS transistor 452 turns off, and the output of the detection signal V_OUT from the buffer 27 stops (low level).

In this way, the read circuit 22 outputs the detection signal V_OUT at high level in a period of time from the timing when a photon is incident on the photodiode 21 and avalanche current is generated to cause the NMOS transistor 452 to turn on to the timing when the avalanche current stops and the NMOS transistor 452 turns off. The output detection signal V_OUT is input to the SPAD adder 40 for each macro-pixel 30 through the output circuit 145. Thus, each SPAD adder 40 receives detection signals V_OUT as many as (the detection number) SPAD pixels 20 from which incidence of a photon is detected among a plurality of SPAD pixels 20 that constitute one macro-pixel 30.

1.7 SPAD Adder

Figure 6:
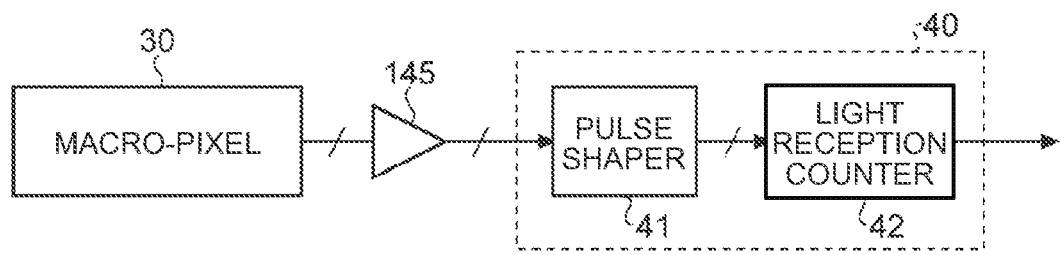
FIG. 6 is a block diagram illustrating the detail of a configuration example of a SPAD adder according to the first embodiment.

FIG. 6 is a block diagram illustrating the detail of a configuration example of the SPAD adder according to the present embodiment. The SPAD adder 40 may be included in the light-receiving unit 14 or may be included in the computing unit 15.

As illustrated in FIG. 6, the SPAD adder 40 includes, for example, a pulse shaper 41 and a light reception counter 42.

The pulse shaper 41 shapes the pulse waveform of the detection signal V_OUT input from the SPAD array 141 through the output circuit 145 into a pulse waveform having a time duration in accordance with the operating clock of the SPAD adder 40.

The light reception counter 42 counts the detection signals V_OUT input in each sampling period from the corresponding macro-pixel 30 to count the number (detection number) of SPAD pixels 20 in which incidence of a photon is detected in each sampling period, and outputs the count value as a pixel value of the macro-pixel 30.

1.8 Sampling Period

As used herein the sampling period refers to the period in which the time (time of flight) from when the light-emitting unit 13 emits laser light L1 to when the light-receiving unit 14 detects incidence of a photon is measured. This sampling period is set to a shorter period than the light emission interval of the light-emitting unit 13. For example, with a shorter sampling period, the time of flight of the photon emitted from the light-emitting unit 13 and reflected by the object 90 can be calculated with a higher time resolution. This means that setting a higher sampling frequency enables calculation of the distance to the object 90 at a higher distance measurement resolution.

For example, letting t be the flight time from when the laser light L1 is emitted by the light-emitting unit 13 and reflected by the object 90 to when the reflected light L2 is incident on the light-receiving unit 14, given that the speed of light C is constant (C~300,000,000 m (meters)/s (seconds), the distance L to the object 90 can be calculated by Expression (1) below.

$$L = C \times t/2 \tag{1}$$

When the sampling frequency is 1 GHz, the sampling period is 1 ns (nanosecond). In this case, one sampling period corresponds to 15 cm (centimeters). This indicates that the distance measurement resolution is 15 cm when the sampling frequency is 1 GHz. When the sampling frequency is doubled to 2 GHz, the sampling period is 0.5 ns (nanoseconds) and one sampling period corresponds to 7.5 cm (centimeters). This indicates that when the sampling frequency is doubled, the distance measurement resolution can be halved. In this way, setting a higher sampling frequency and a shorter sampling period enables the distance to the object 90 to be calculated more accurately.

1.9 Depth Image

Figure 7:
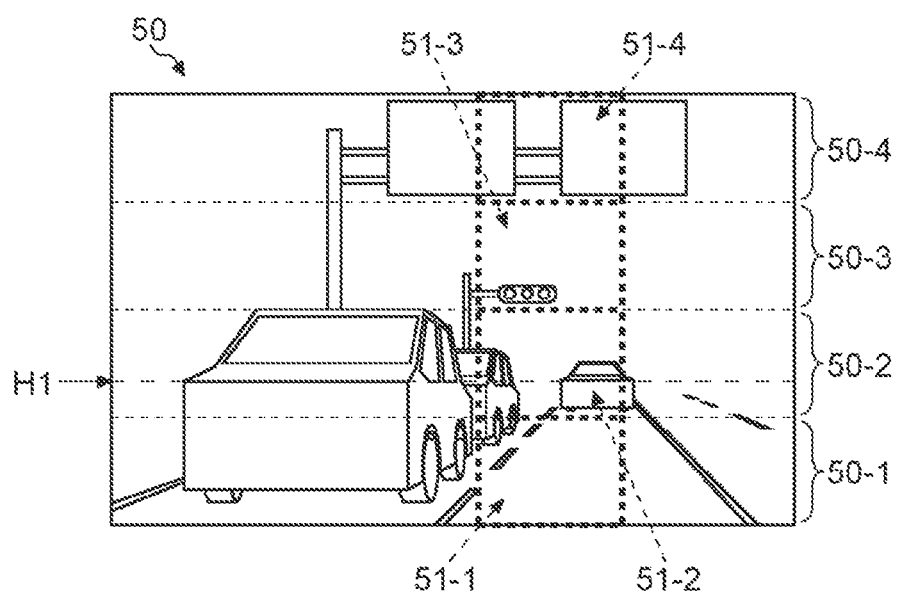
FIG. 7 is a diagram illustrating an exemplary depth image acquired by the ToF sensor according to the first embodiment.

FIG. 7 is a diagram illustrating an exemplary depth image acquired by the ToF sensor according to the present embodiment, specifically illustrating an exemplary depth image acquired by the ToF sensor 1 installed to face the front of a vehicle. As illustrated in FIG. 7, in the present embodiment, every time laser light L1 is scanned in the lateral direction, a depth image 50 corresponding to the distance measurement range AR is acquired as depth information to an object present in the distance measurement range AR. Therefore, as illustrated in FIG. 4, when the longitudinal use SPAD array 142 is divided into four in the longitudinal direction, the depth image 50 can be divided into four regions 50-1 to 50-4 arranged in the longitudinal direction. A first region 50-1 is a depth image acquired in the SPAD region 142-1, a second region 50-2 is a depth image acquired in the SPAD region 142-2, a third region 50-3 is a depth image acquired in the SPAD region 142-3, and a fourth region 50-4 is a depth image acquired in the SPAD region 142-4.

The first region 50-1 located at the bottom is, for example, a depth image in the vicinity of the foot of the vehicle equipped with the ToF sensor 1. The first region 50-1 is therefore likely to include an object present at a short distance from the vehicle, such as a road surface, a white line, and a curb.

The fourth region 50-4 located at the top is, for example, a depth image above the vehicle. The fourth region 50-4 is therefore likely to include an object present at a long distance from the vehicle, such as a mark and a sign.

The second region 50-2 is, for example, a depth image at the lower front of the vehicle. The second region 50-2 is therefore likely to include, for example, an object at an intermediate distance between the short distance and the long distance, such as a vehicle ahead in close proximity or a road surface.

The third region 50-3 is, for example, a depth image at the upper front of the vehicle. The third region 50-3 is therefore likely to include, for example, an object at an intermediate distance between the short distance and the long distance and at a longer distance from the object likely to be included in the second region 50-2, such as a vehicle ahead with enough space or a road structure such as a traffic light.

A horizontal line H1 may be included in the second region 50-2 or may be included in the third region 50-3. However, the horizontal line H1 is not limited thereto and may be included in the first or fourth region 50-1 or 50-4 or may not be included in any of the regions 50-1 to 50-4.

For one or multiple emissions of laser light L1 for acquiring a depth image in a certain region (angle of view), a frame image in a region corresponding to the angle of view of the use SPAD array 142 illustrated by broken lines in FIG. 7 is acquired. Hence, when the use SPAD array 142 is divided into four in the longitudinal direction, a frame image 51-1 corresponding to the angle of view of the SPAD region 142-1, a frame image 51-2 corresponding to the angle of view of the SPAD region 142-2, a frame image 51-3 corresponding to the angle of view of the SPAD region 142-3, and a frame image 51-4 corresponding to the angle of view of the SPAD region 142-4 are acquired for one or multiple emissions of laser light L1 for acquiring a depth image in a certain region (angle of view). The frame images 51-1 to 51-4 are slid in the lateral direction with scanning of laser light L1 in the lateral direction.

1.10 Histogram

Figure 8:
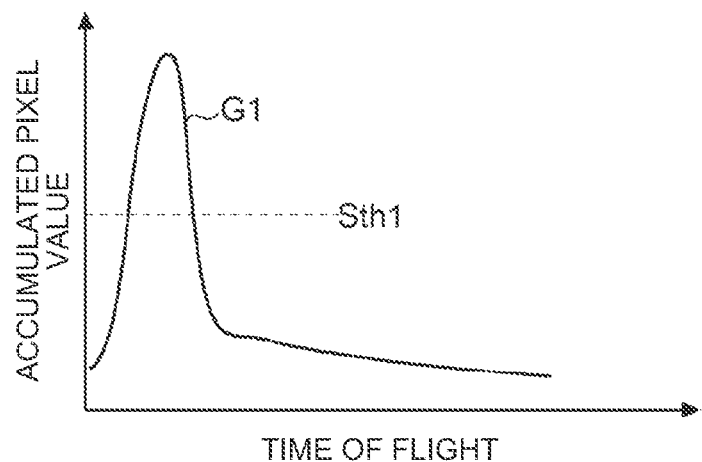
FIG. 8 is a diagram illustrating an exemplary histogram generated based on a frame image obtained from a SPAD region in charge of a first region in FIG. 7.
Figure 9:
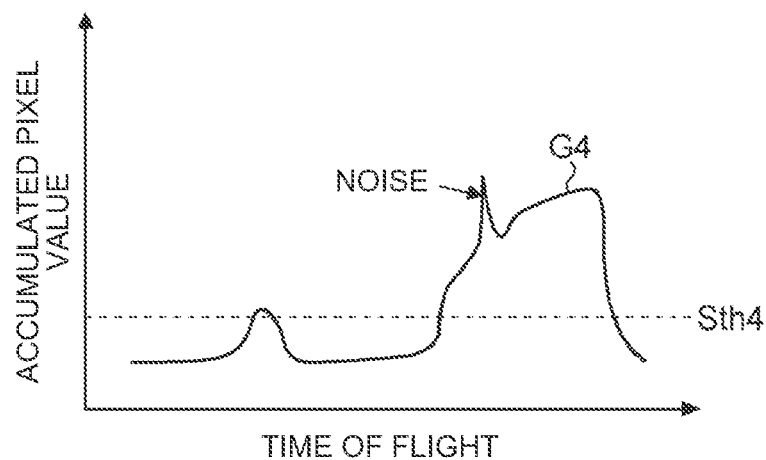
FIG. 9 is a diagram illustrating an exemplary histogram generated based on a frame image obtained from a SPAD region in charge of a fourth region in FIG. 7.

Now pay attention to the first region 50-1 located at the bottom and the fourth region 50-4 located at the top. In general, an object present in the vicinity of the foot of a device corresponding to the first region 50-1 is located near the device, and an object present above the device corresponding to the fourth region 50-4 is located far from the device. Hence, as illustrated in FIG. 8, in a histogram G1 generated based on the frame image 51-1 obtained from the SPAD region 142-1 in charge of the first region 50-1, the accumulated pixel value reaches a peak at an earlier time of flight, whereas as illustrated in FIG. 9, in a histogram G4 generated based on the frame image 51-4 obtained from the SPAD region 142-4 in charge of the fourth region 50-4, the accumulated pixel value reaches a peak at a later time of flight.

1.11 Problem of Common Computation Coefficient

Figure 10:
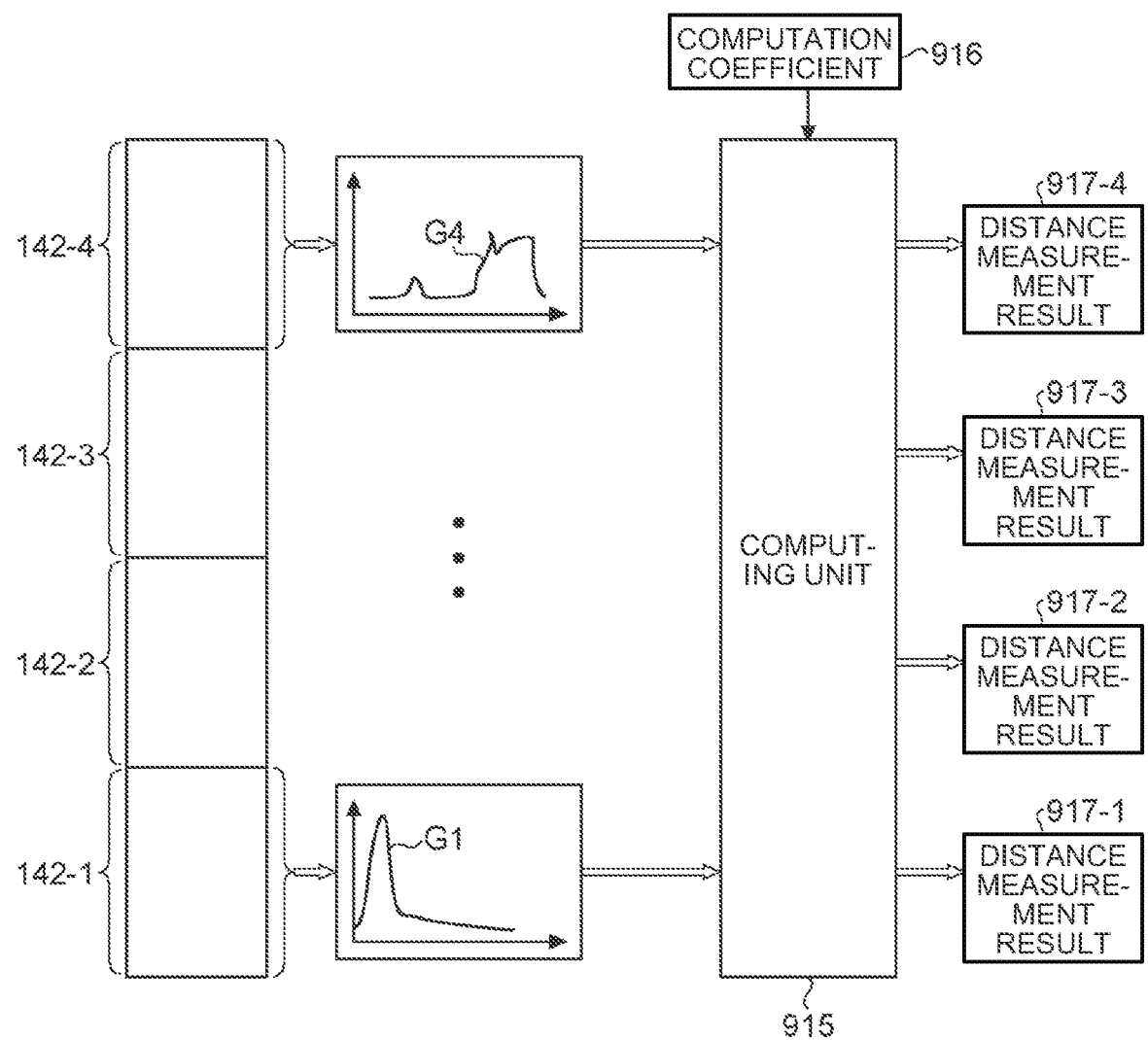
FIG. 10 is a block diagram illustrating an overall configuration example of a computing unit according to a comparative example.

As illustrated in FIG. 10, therefore, when a computation process is performed to calculate the distance to an object using a common computing unit 915 and a common computation coefficient 916 for the frame images 51-1 to 51-4 respectively obtained from the SPAD regions 142-1 to 142-4, respective distance measurement results 917-1 to 917-4 are not necessarily calculated using an optimal computation coefficient and, accordingly, the distance measurement accuracy may be deteriorated in some cases.

1.12 Computation Process According to First Embodiment

Figures 11, 12:
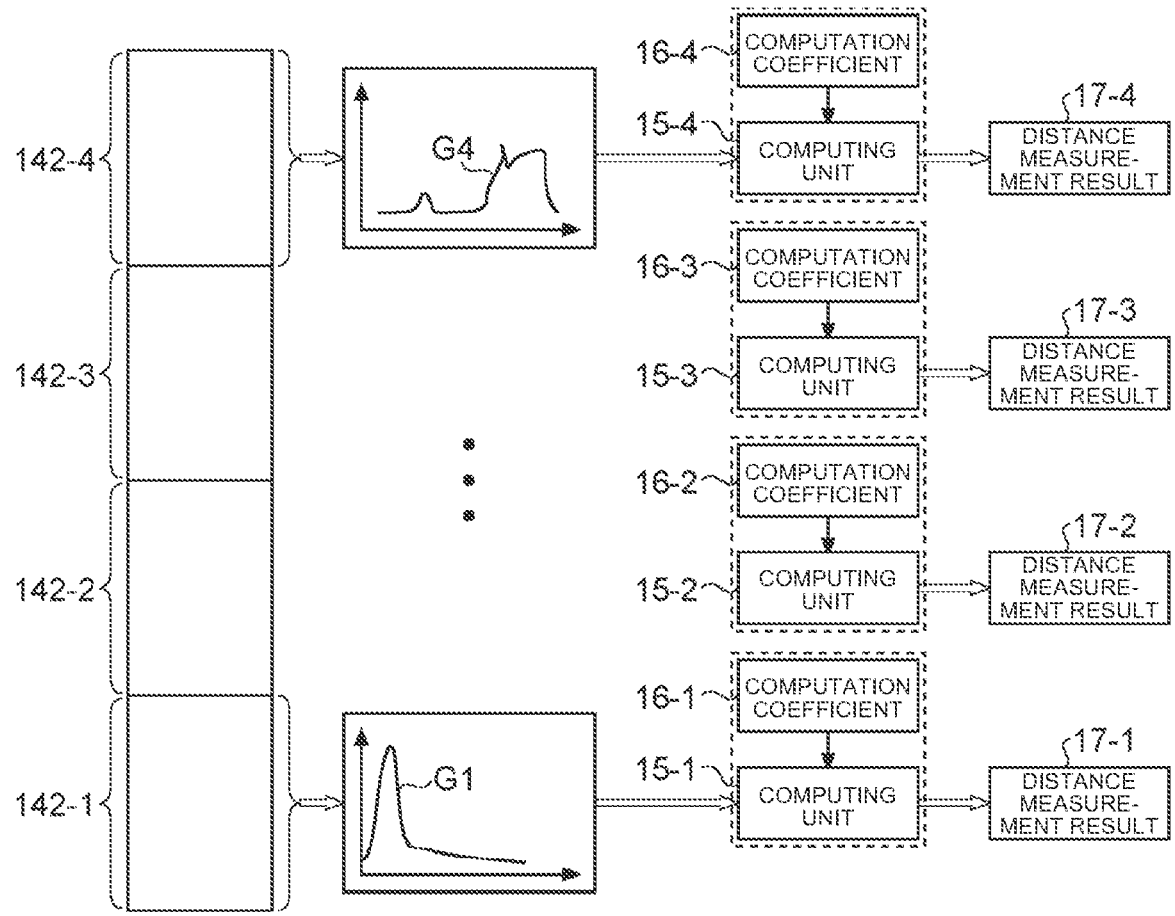
FIG. 11 is a block diagram illustrating an overall configuration example of computing units according to the first embodiment.
FIG. 12 is a diagram illustrating an example of computation coefficients according to the first embodiment.

Then, in the present embodiment, as illustrated in FIG. 11, the computing unit 15 is divided into four computing units 15-1 to 15-4 in one-to-one correspondence to four SPAD regions 142-1 to 142-4, and individual computation coefficients 16-1 to 16-4 are set for the computing units 15-1 to 15-4, respectively.

With such a configuration, individual computation coefficients 16-1 to 16-4 appropriate for the predicted distances to an object can be set for the computing units 15-1 to 15-4, so that the distance measurement results 17-1 to 17-4 can be calculated with respective optimal computation coefficients. Hence, even when an object at a short distance and an object at a long distance are present in the distance measurement range AR, reduction in distance measurement accuracy can be decreased.

For example, for the computing unit 15-1 corresponding to the SPAD region 142-1 in which an object is likely to be at a short distance, a high threshold Sth1 (see FIG. 8) can be set as a threshold for extracting a component of reflected light L2 from the detected light and a filter coefficient for removing a low-frequency noise component can be set as the computation coefficient 16-1, whereas for the computing unit 15-4 corresponding to the SPAD region 142-4 in which an object is likely to be at a long distance, a low threshold Sth4 (see FIG. 9) can be set as a threshold and a filter coefficient for removing a high-frequency noise component can be set as the computation coefficient 16-4.

Similarly, for the computing units 15-2 and 15-3, optimal computation coefficients 16-2 and 16-3 appropriate for the predicted distances to an object in the second region 50-2 and the third region 50-3 can be set.

1.13 Examples of Computation Coefficients

Examples of the computation coefficients 16-1 to 16-4 set in the computing units 15-1 to 15-4 according to the present embodiment include, as illustrated in FIG. 12, a threshold (hereinafter referred to as echo threshold) for extracting a component of reflected light L2 from the detected light and a filter coefficient for removing a noise component (hereinafter simply referred to as filter coefficient), which are described above, and a resolution of the depth image to be acquired (hereinafter simply referred to as resolution), a frame rate at which a depth image is read from the use SPAD array 142 (hereinafter simply referred to as frame rate), and an output range (time range) of a histogram (hereinafter referred to as histogram output range).

As described above, the echo threshold is a threshold for extracting a component of reflected light L2 from light detected by the SPAD pixel 20. As illustrated in FIG. 12, for example, a higher value may be set for the first region 50-1 in which an object is likely to be at a short distance, and a lower value may be set for the fourth region 50-4 in which an object is likely to be at a long distance.

As described above, the filter coefficient is a filter coefficient for removing a noise component from the constructed histogram. As illustrated in FIG. 12, for example, a filter coefficient for cutting off a lower-frequency component may be set for the first region 50-1, and a filter coefficient for cutting off a higher-frequency component may be set for the fourth region 50-4.

As described above, the resolution can be changed, for example, by changing the number of macro-pixels 30 that constitute one pixel. As illustrated in FIG. 12, for example, the resolution may be set to a higher value in the first region 50-1 and to a lower value in the fourth region 50-4. Setting a lower resolution can increase the dynamic range of one pixel and enables detection of weak reflected light L2 reflected by an object at a long distance. On the other hand, setting a higher resolution enables acquisition of a finer depth image and therefore can enhance the distance measurement accuracy.

The frame rate can be changed, for example, by changing the number of bins of a histogram constructed by a histogram circuit 152 described later and the light emission intervals of the light-emitting unit 13. For example, the frame rate can be doubled by halving the number of bins of the histogram and doubling the light emission intervals of the light-emitting unit 13. As illustrated in FIG. 12, for example, this frame rate may be set to a higher value in the first region 50-1 and to a lower value in the fourth region 50-4. Setting a higher frame rate enables measurement of the distance to an object at higher cycles and therefore can quickly start a reaction to the object. On the other hand, setting a lower frame rate can reduce the data processing volume and therefore can achieve a shorter process time and reduction in consumption power.

The histogram output range can be changed, for example, by changing the output range (time range) of the constructed histogram. For example, when the distance to an object located at a short distance is calculated, an earlier time range in the histogram is output, thereby reducing the output band. On the other hand, when the distance to an object located at a long distance is calculated, a later time range in the histogram is output, thereby reducing the output band similarly. As illustrated in FIG. 12, for example, the output range of the histogram may be set to an earlier time range in the histogram for the first region 50-1 and to a later time range for the fourth region 50-4. Narrowing the output range of the histogram can reduce the data processing volume and therefore can achieve a shorter process time and reduction in consumption power.

However, the computation coefficients described above are given only by way of example and the computation coefficients may be added and modified in various ways. For example, the computation coefficients may include a value for subtracting noise due to disturbance light from the histogram or a sampling frequency.

1.14 Overall Configuration Example of Computing Unit

Figure 13:
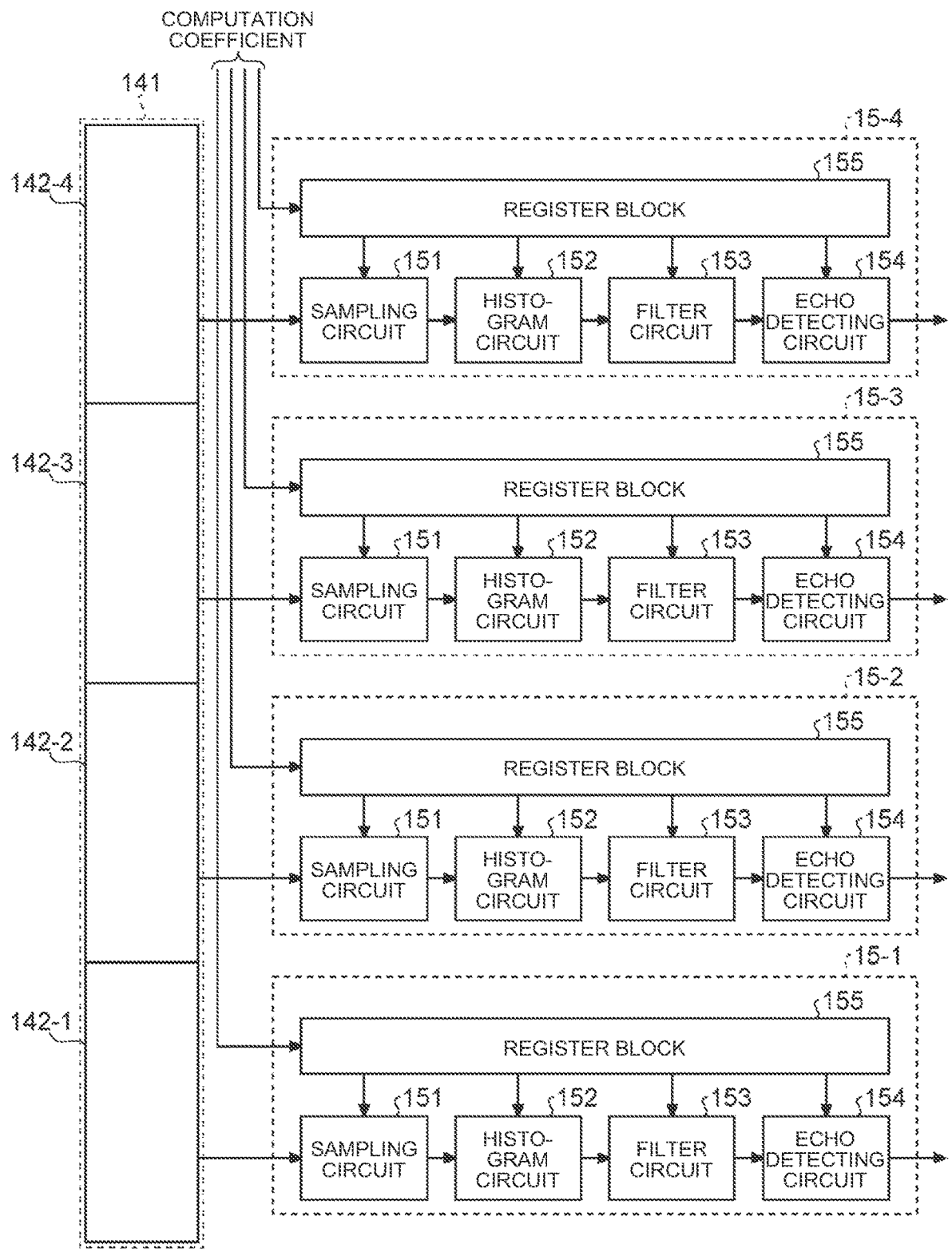
FIG. 13 is a block diagram illustrating an overall configuration example of the computing units according to the first embodiment.

FIG. 13 is a block diagram illustrating an overall configuration example of the computing unit according to the present embodiment. As illustrated in FIG. 13, the computing units 15-1 to 15-4 each include a sampling circuit 151, the histogram circuit 152, a filter circuit 153, an echo detecting circuit 154, and a register block 155.

The register block 155 is a memory region configured with, for example, a static random access memory (SRAM) and stores individual computation coefficients for use in respective computation processes executed by the sampling circuit 151, the histogram circuit 152, the filter circuit 153, and the echo detecting circuit 154 that belong to the same computing unit.

The sampling circuit 151 calculates a pixel value per pixel, for example, by adding the detection signals for each macro-pixel 30 output from the SPAD adder 40, in units of a predetermined number of macro-pixels, in accordance with the resolution among the computation coefficients stored in the register block 155 in the same computing unit. This addition may be executed synchronously in the use SPAD array 142 as a whole.

The histogram circuit 152 constructs a histogram for each pixel (for example, see FIG. 8 or FIG. 9), for example, by adding the pixel values for each pixel calculated synchronously in the sampling circuit 151 to a bin corresponding to the sampling period in the histogram of the pixel, in other words, the value of the bin corresponding to the time of flight, in accordance with the frame rate and/or the construction range of the histogram among the computation coefficients stored in the register block 155 in the same computing unit.

The filter circuit 153 removes noise in a frequency band corresponding to the filter coefficient, for example, by performing a filtering process for the histogram constructed by the histogram circuit 152, in accordance with the filter coefficient for cutting off noise among the computation coefficients stored in the register block 155 in the same computing unit.

The echo detecting circuit 154, for example, extracts a component of reflected light L2 from the histogram after noise removal, in accordance with the echo threshold among the computation coefficients stored in the register block 155 in the same computing unit, and calculates the distance to an object visualized in each pixel from a bin number (time of flight) at which the accumulated pixel value reaches a peak, in the extracted component of reflected light L2.

The frame images 51-1 to 51-4 configured with the distances to an object calculated as described above may be input, for example, to the host 80 through the control unit 11 and/or the external I/F 19.

1.15 Setting of Computation Coefficient in Register Block

Figure 14:
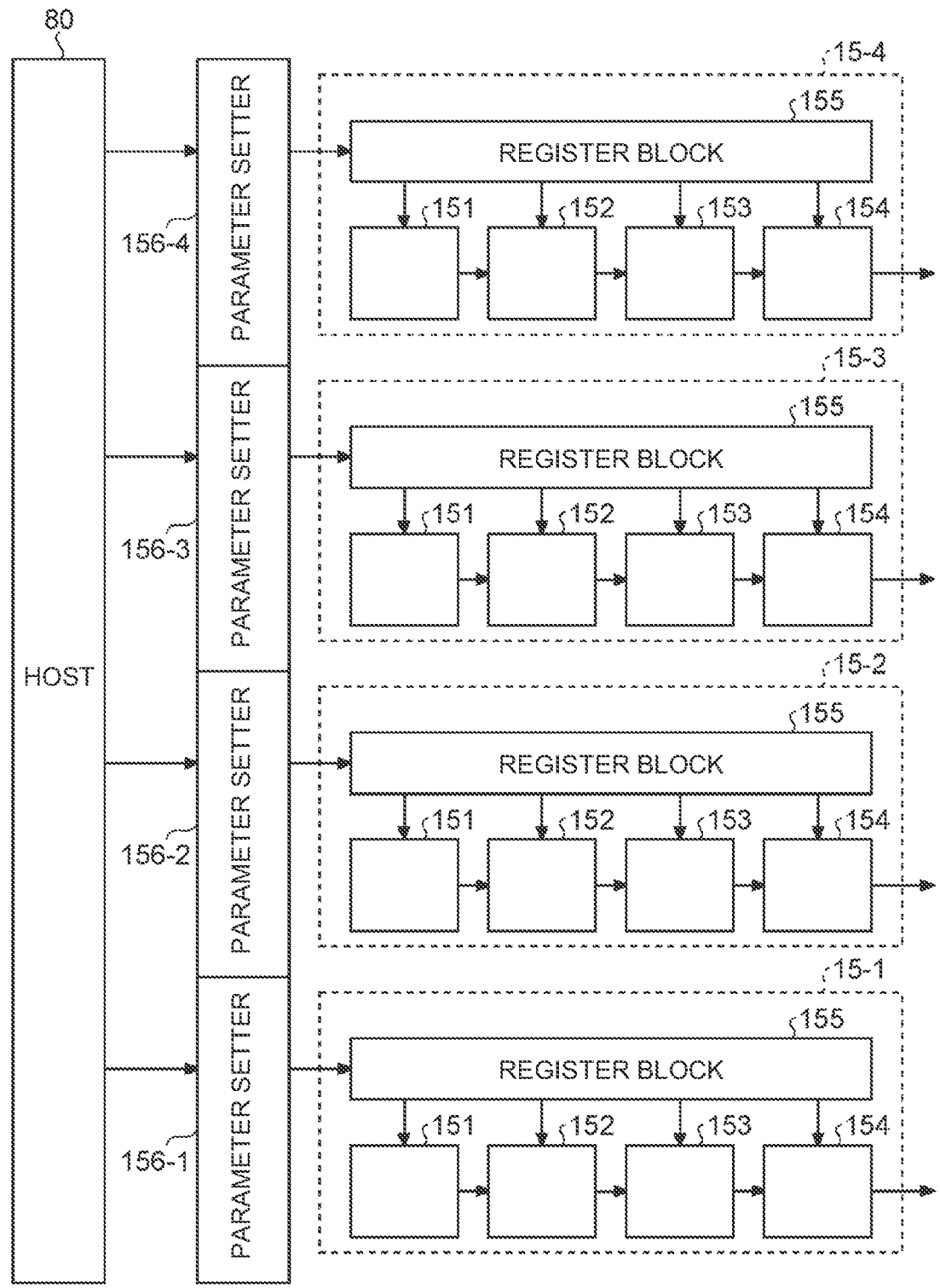
FIG. 14 is a diagram illustrating the setting of computation coefficients in the computing units according to the first embodiment.

As illustrated in FIG. 14, the computation coefficients in the register blocks 155 of the computing units 15-1 to 15-4 may be set, for example, through parameter setters 156-1 to 156-4 provided one-to-one for the computing units 15-1 to 15-4. The parameter setters 156-1 to 156-4 may be a part of the control unit 11 or may be separate from the control unit 11.

The parameter setters 156-1 to 156-4 store, for example, the computation coefficients specified by the host 80 into the respective register blocks 155 in the computing units 15-1 to 15-4, based on the register addresses input together with the computation coefficients.

Figure 15:
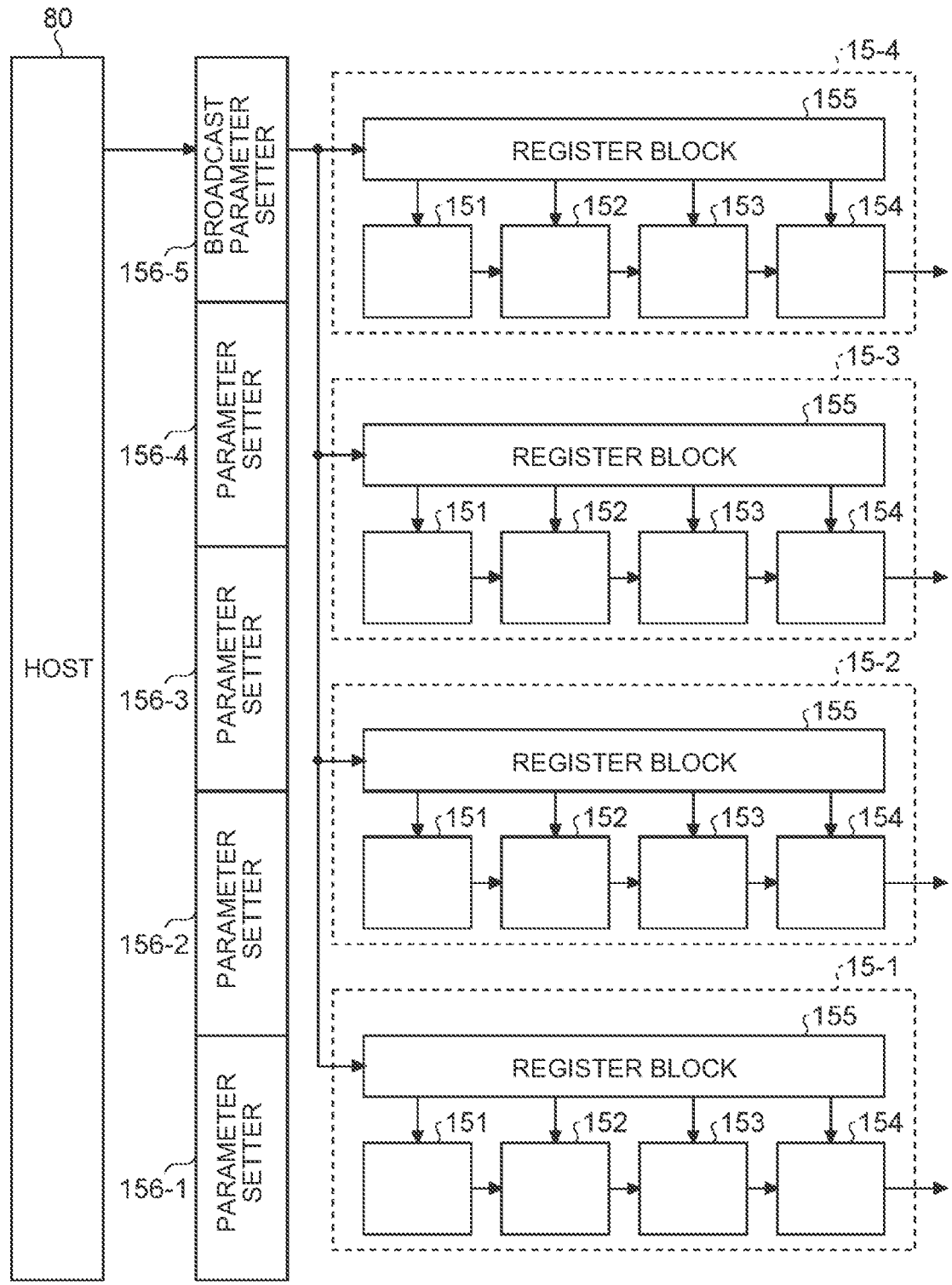
FIG. 15 is a diagram illustrating the setting of computation coefficients in the computing units according to a modification to the first embodiment.

Alternatively, as illustrated in FIG. 15, a common broadcast parameter setter 156-5 may be provided for the respective register blocks 155 in the computing units 15-1 to 15-4, aside from the parameter setters 156-1 to 156-4. In this case, the broadcast parameter setter 156-5 may store the computation coefficients specified by the host 80 into the respective register blocks 155 in the computing units 15-1 to 15-4, based on the register addresses input together with the computation coefficients.

In place of the host 80, the control unit 11 in the ToF sensor 1 may input a computation coefficient and a register address to each of the parameter setters 156-1 to 156-4 or the broadcast parameter setter 156-5.

Furthermore, the computation coefficient input from the host 80 or the control unit 11 to each of the parameter setters 156-1 to 156-4 or the broadcast parameter setter 156-5 may be preset as a fixed value, may be generated by the host 80 or the control unit 11, for example, based on a frame image in the past, or may be set by the user for the host 80 or the control unit 11.

1.16 Chip Configuration Example of Light-Receiving Unit and Computing Unit

Figure 16:
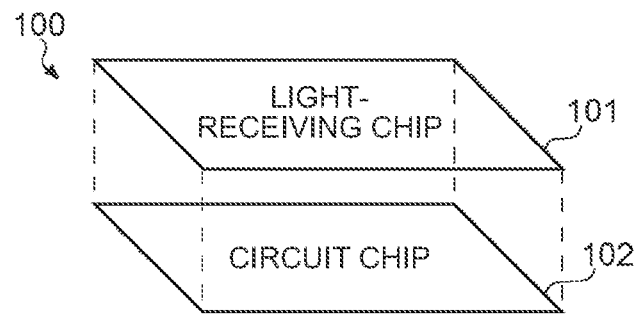
FIG. 16 is a diagram illustrating a stack structure example of the light-receiving unit and the computing unit in the ToF sensor according to the first embodiment.

FIG. 16 is a diagram illustrating a stack structure example of the light-receiving unit and the computing unit in the ToF sensor according to the present embodiment. As illustrated in FIG. 16, the light-receiving unit 14 and the computing unit 15 have a structure of a laminated chip 100 in which a light-receiving chip 101 and a circuit chip 102 are laminated above and below. The light-receiving chip 101 is, for example, a semiconductor chip including the SPAD array 141 in which the photodiodes 21 in the SPAD pixels 20 of the light-receiving unit 14 are arranged. The circuit chip 102 is, for example, a semiconductor chip in which the constituents excluding the photodiodes 21 in the SPAD pixels 20 in the light-receiving unit 14 and the computing unit 15 in FIG. 1 are disposed.

For example, the light-receiving chip 101 and the circuit chip 102 may be directly bonded to each other, namely, the respective joint surfaces are planarized and laminated by interelectronic force. However, the bonding is not limited thereto. For example, Cu—Cu bonding of bonding copper (Cu) electrode pads formed on the joint surfaces, bump bonding, and the like may be used.

The light-receiving chip 101 and the circuit chip 102 are electrically connected, for example, through a connection part such as a through-silicon via (TSV) passing through the semiconductor substrate. For the connection using TSV, for example, the following technologies can be employed: twin TSV technology in which two TSVs, namely, a TSV provided in the light-receiving chip 101 and a TSV provided from the light-receiving chip 101 to the circuit chip 102 are connected with the chip surface facing out; and shared TSV technology in which a TSV passing through the light-receiving chip 101 to the circuit chip 102 connects them.

However, when the light-receiving chip 101 and the circuit chip 102 are bonded using Cu—Cu bonding or bump bonding, the chips are electrically connected through the Cu—Cu joint or the bump joint.

The laminated chip 100 illustrated in FIG. 16 may include the light-emitting unit 13, the control unit 11, and other units, in addition to the light-receiving unit 14 and the computing unit 15.

1.17 Two-Dimensional Layout Example of Chip

Figure 17:
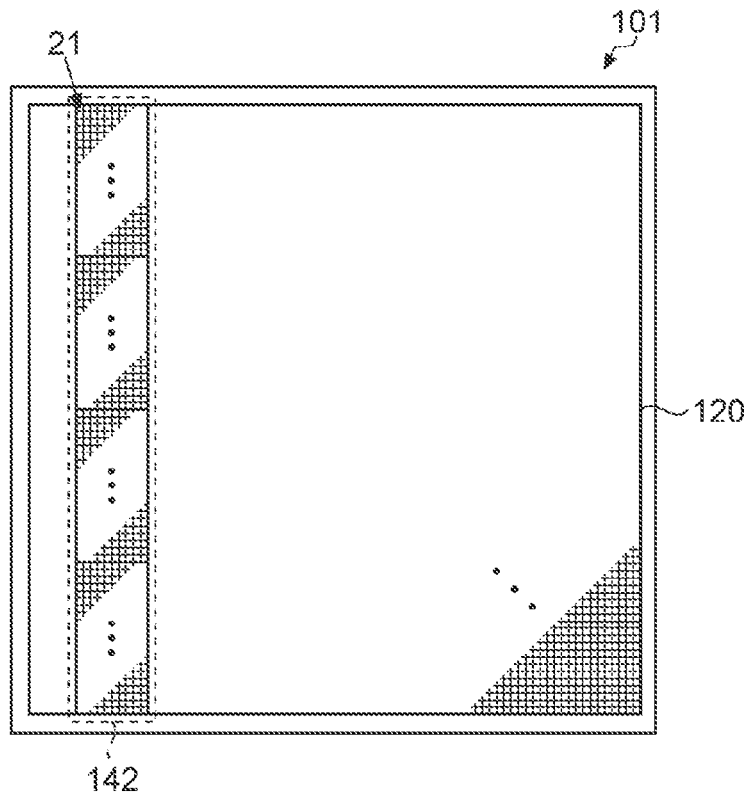
FIG. 17 is a diagram illustrating an exemplary two-dimensional layout of a light-receiving surface in a light-receiving chip according to the first embodiment.

FIG. 17 is a diagram illustrating an exemplary two-dimensional layout of a light-receiving surface in the light-receiving chip 101. As illustrated in FIG. 17, a plurality of photodiodes 21 are arranged in a two-dimensional grid in an effective pixel region 120 in the light-receiving surface of the light-receiving chip 101. The photodiodes 21 of the SPAD pixels 20 belonging to the use SPAD array 142 may be a part of the photodiodes 21 or all of the photodiodes 21 in the effective pixel region 120.

Figure 18:
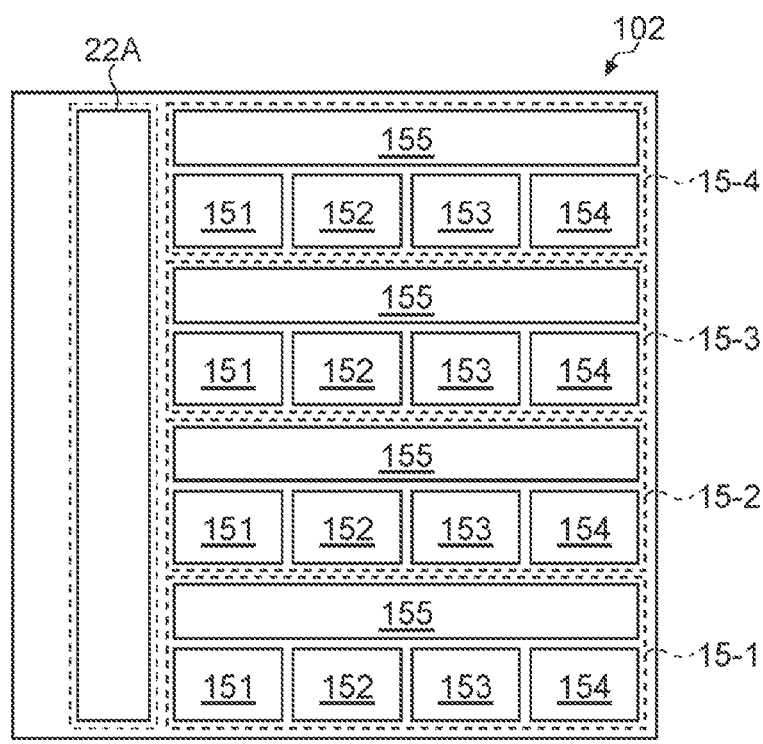
FIG. 18 is a diagram illustrating a two-dimensional layout example of a surface on the light-receiving chip side of a circuit chip according to the first embodiment.

FIG. 18 is a diagram illustrating a two-dimensional layout example of a surface on the light-receiving chip 101 side in the circuit chip 102. As illustrated in FIG. 18, a read circuit region 22A, in which the read circuits 22 in the SPAD pixels 20 are arranged in a two-dimensional grid is disposed in a region corresponding to the region of the use SPAD array 142 in the circuit chip 102. Four computing units 15-1 to 15-4 are disposed in parallel in a region adjacent to the read circuit region 22A.

In each of the computing units 15-1 to 15-4, the sampling circuit 151, the histogram circuit 152, the filter circuit 153, and the echo detecting circuit 154 are disposed in order from the region close to the read circuit region 22A. In this way, the circuits are disposed in the order of executing a process for the detection signal output from the read circuit 22. This arrangement can reduce the wiring length from readout to output and can reduce signal delay and the like.

The register block 155 is disposed in parallel with a row of the sampling circuit 151, the histogram circuit 152, the filter circuit 153, and the echo detecting circuit 154. In this way, the register block 155 is disposed in proximity to the sampling circuit 151, the histogram circuit 152, the filter circuit 153, and the echo detecting circuit 154. This arrangement can simplify routing of a signal line from the register block 155 to each circuit.

In addition, dividing the computing unit into four computing units 15-1 to 15-4 as described above facilitates circuit design of each individual computing unit and allows a circuit pattern of one computing unit to be used in four other computing units. This leads to an advantage of significantly reducing the time and effort required for circuit design.

1.18 Operation and Effects

As described above, according to the present embodiment, the angle of view of the use SPAD array 142 is divided into a plurality of regions (corresponding to the frame images 51-1 to 51-4), and an independent computation coefficient can be set for each region, so that an optimal computation coefficient for each region can be set in accordance with the distance to an object likely to be visualized in each individual region. Accordingly, the distance to an object can be calculated using the optimal computation coefficient for each region, so that reduction in distance measurement accuracy can be decreased, for example, even when an object at a short distance and an object at a long distance are present in the distance measurement range AR.

In addition, since the same circuit pattern can be used for the respective computing units 15-1 to 15-4 for the regions, the time and effort required for circuit design can be significantly reduced.

Furthermore, for example, when a distance measurement process is not performed for a part of the regions, power supply to the corresponding computing unit (any of the computing units 15-1 to 15-4) can be stopped. This is advantageous in that power consumption can be reduced depending on situations.

In the present embodiment, the angle of view SR of the use SPAD array 142 is reciprocatively scanned in the horizontal direction. However, the scan direction is not limited thereto. The angle of view SR of the use SPAD array 142 may be reciprocatively scanned in the vertical direction, where the longitudinal direction of the use SPAD array 142 is the horizontal direction.

As illustrated in FIG. 7, the depth image 50 may be divided into a plurality of regions 50-1 to 50-4 in a flash-type ToF sensor in which the entire effective pixel region of the SPAD array 141 is set as the angle of view and this angle of view is fixed.

2. Second Embodiment

A second embodiment will now be described in detail below with reference to the drawings. In the following description, a configuration similar to that of the first embodiment described above is hereby incorporated and will not be further elaborated.

In the foregoing first embodiment, each of the divided four computing units 15-1 to 15-4 includes the individual register block 155 (see, for example, FIG. 13 or FIG. 14). In contrast, in the second embodiment, the register block is shared by a plurality of computing units.

2.1 Overall Configuration Example of Computing Unit

Figure 19:
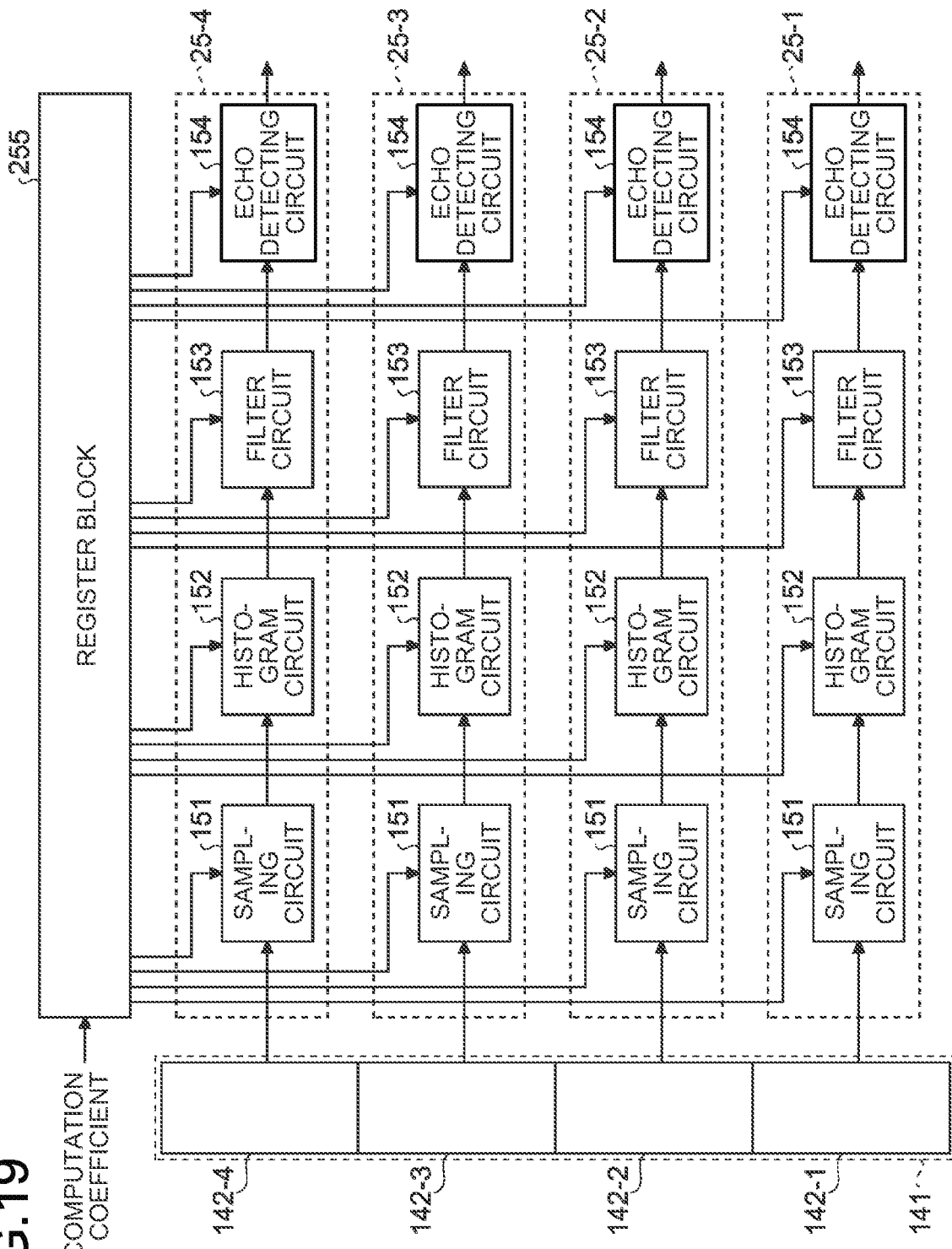
FIG. 19 is a block diagram illustrating an overall configuration example of the computing units according to a second embodiment.

FIG. 19 is a block diagram illustrating an overall configuration example of the computing unit according to the present embodiment. As illustrated in FIG. 19, in the present embodiment, the computing unit 15 (see FIG. 1) is configured with four computing units 25-1 to 25-4 and a shared register block 255.

The computing units 25-1 to 25-4 each include, similarly to the computing units 15-1 to 15-4 according to the first embodiment, a sampling circuit 151, a histogram circuit 152, a filter circuit 153, and an echo detecting circuit 154.

The register block 255 stores computation coefficients 16-1 to 16-4 corresponding to regions 50-1 to 50-4 handled by the computing units 25-1 to 25-4 and sets appropriate computation coefficients 16-1 to 16-4 for the sampling circuit 151, the histogram circuit 152, the filter circuit 153, and the echo detecting circuit 154 in the computing units 25-1 to 25-4.

2.2 Two-Dimensional Layout Example of Circuit Chip

Figure 20:
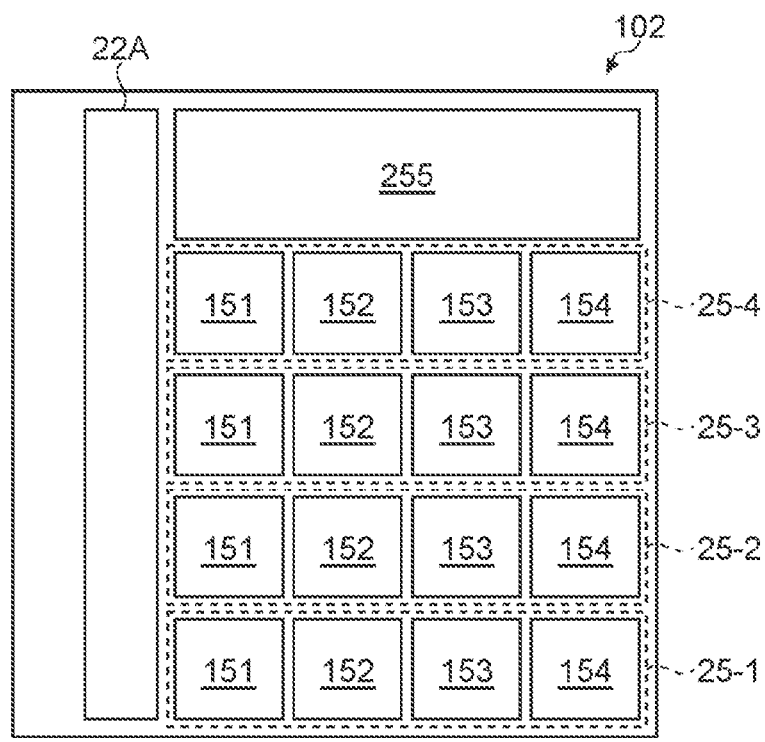
FIG. 20 is a diagram illustrating a two-dimensional layout example of a surface on the light-receiving chip side of the circuit chip according to the second embodiment.

FIG. 20 is a diagram illustrating a two-dimensional layout example of a surface on the light-receiving chip side of a circuit chip according to the present embodiment. As illustrated in FIG. 20, in a circuit chip 102 according to the present embodiment, four computing units 25-1 to 25-4 are disposed in parallel in a region adjacent to a read circuit region 22A. The register block 255 is disposed, for example, on the side adjacent to a region in which four computing units 25-1 to 25-4 are arranged, in the arrangement direction. However, the layout is not limited thereto, and the register block 255 may be disposed on the opposite side to the read circuit region 22A with four computing units 25-1 to 25-4 interposed.

2.3 Operation and Effects

Even with such a configuration, the distance to an object can be calculated using an optimal computation coefficient for each region in the same manner as in the first embodiment, so that reduction in distance measurement accuracy can be decreased, for example, even when an object at a short distance and an object at a long distance are present in the distance measurement range AR.

Other configuration, operation, and effects may be similar to those in the foregoing embodiment and will not be further elaborated here.

3. Third Embodiment

In the second embodiment, the register block 255 is shared by a plurality of computing units 25-1 to 25-4. In contrast, in a third embodiment, the computing unit is shared by a plurality of SPAD regions 142-1 to 142-4. In the following description, a configuration similar to that of the foregoing embodiments is hereby incorporated and will not be further elaborated.

3.1 Overall Configuration Example of Computing Unit

Figure 21:
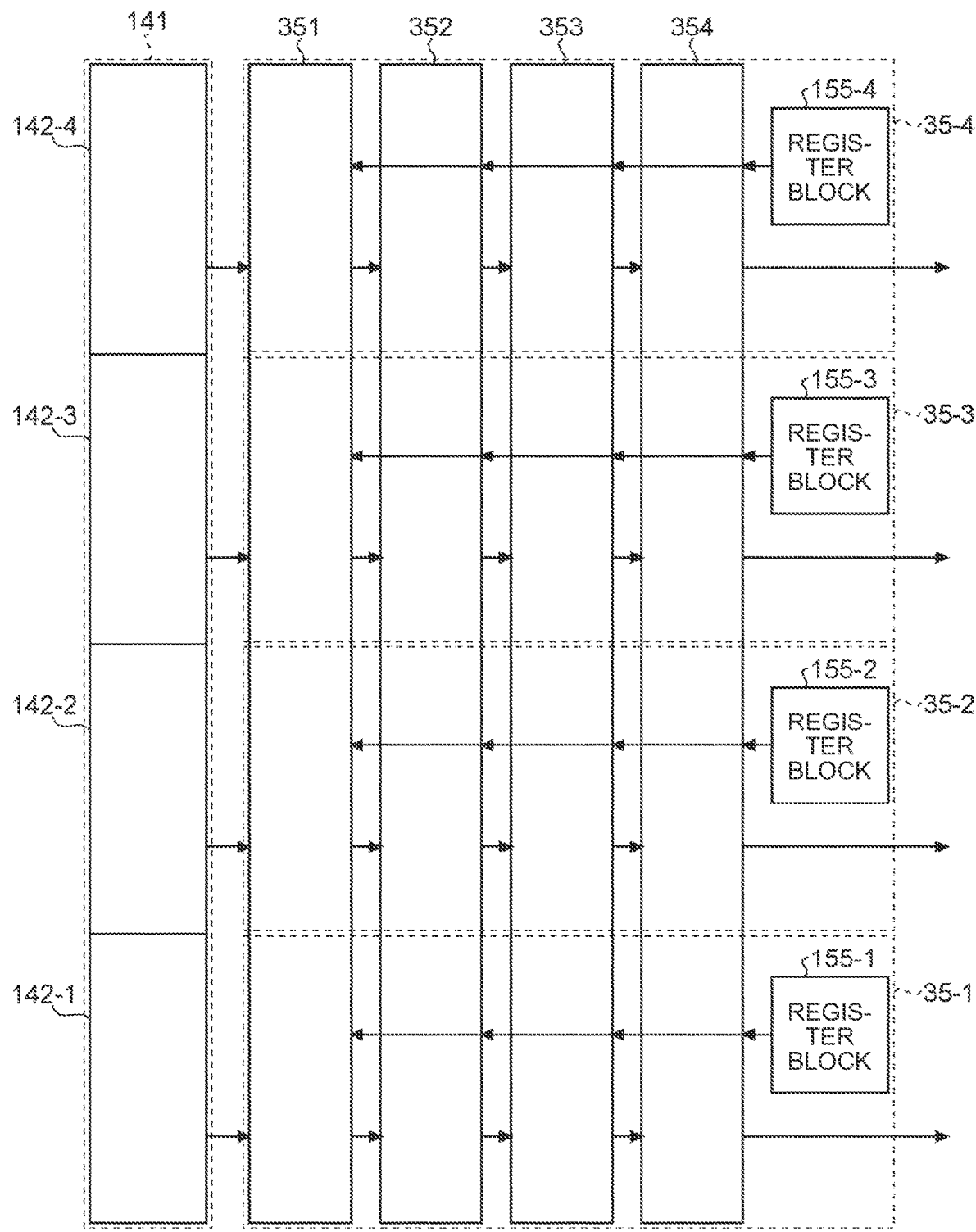
FIG. 21 is a block diagram illustrating an overall configuration example of the computing units according to a third embodiment.

FIG. 21 is a block diagram illustrating an overall configuration example of the computing unit according to the present embodiment. As illustrated in FIG. 21, the computing unit 15 according to the present embodiment (see FIG. 1) includes a sampling circuit 351, a histogram circuit 352, a filter circuit 353, and an echo detecting circuit 354, which are shared by four SPAD regions 142-1 to 142-4, and register blocks 155-1 to 155-4 storing individual computation coefficients 16-1 to 16-4 for the SPAD regions 142-1 to 142-4.

Respective partial regions of the sampling circuit 351, the histogram circuit 352, the filter circuit 353, and the echo detecting circuit 354, and the register block 155-1 constitute a computing unit 35-1 that executes a computation process for a signal read from the SPAD region 142-1. Similarly, respective partial regions of the sampling circuit 351, the histogram circuit 352, the filter circuit 353, and the echo detecting circuit 354, and the register block 155-2 constitute a computing unit 35-1 that executes a computation process for a signal read from the SPAD region 142-2. Respective partial regions of the sampling circuit 351, the histogram circuit 352, the filter circuit 353, and the echo detecting circuit 354, and the register block 155-3 constitute a computing unit 35-1 that executes a computation process for a signal read from the SPAD region 142-3. Respective partial regions of the sampling circuit 351, the histogram circuit 352, the filter circuit 353, and the echo detecting circuit 354, and the register block 155-4 constitute a computing unit 35-1 that executes a computation process for a signal read from the SPAD region 142-4.

The computation coefficient 16-1 stored in the register block 155-1 is set in the region belonging to the computing unit 35-1 in the sampling circuit 351, the histogram circuit 352, the filter circuit 353, and the echo detecting circuit 354.

Similarly, the computation coefficients 16-2 to 16-4 stored in the register blocks 155-2 to 155-4 are set as appropriate in the respective regions belonging to the computing units 35-2 to 35-4 in the sampling circuit 351, the histogram circuit 352, the filter circuit 353, and the echo detecting circuit 354.

3.2 Two-Dimensional Layout Example of Circuit Chip

Figure 22:
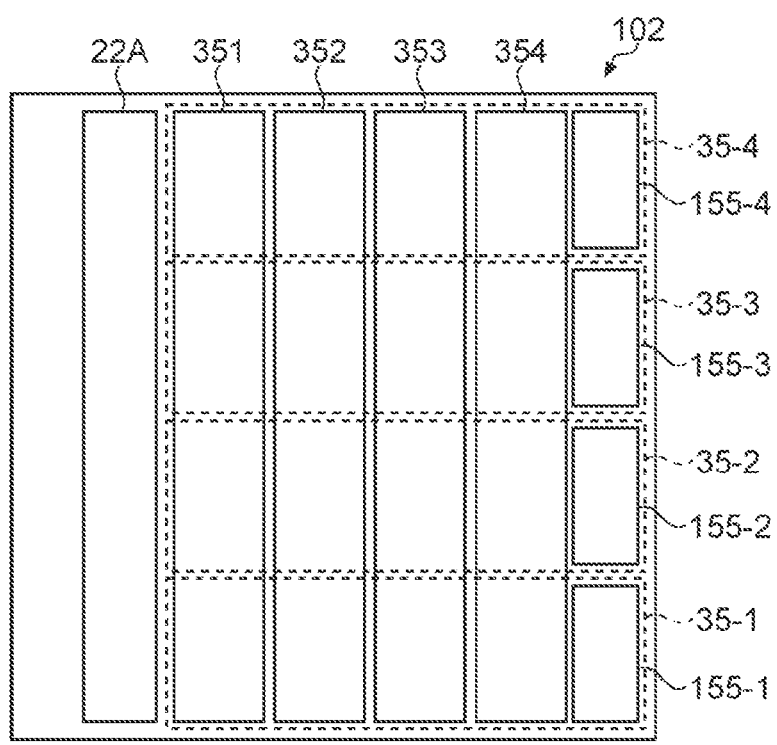
FIG. 22 is a diagram illustrating a two-dimensional layout example of a surface on the light-receiving chip side of the circuit chip according to the third embodiment.

FIG. 22 is a diagram illustrating a two-dimensional layout example of a surface on the light-receiving chip side of a circuit chip according to the present embodiment. As illustrated in FIG. 22, in the circuit chip 102 according to the present embodiment, the shared sampling circuit 351, histogram circuit 352, filter circuit 353, and echo detecting circuit 354 are arranged in order in a region adjacent to the read circuit region 22A. The register blocks 155-1 to 155-4 of the computing units 35-1 to 35-4 are disposed in a region on the opposite side to the read circuit region 22A with the sampling circuit 351, the histogram circuit 352, the filter circuit 353, and the echo detecting circuit 354 interposed.

3.3 Operation and Effects

Even with such a configuration, the distance to an object can be calculated using an optimal computation coefficient for each region in the same manner as in the first embodiment, so that reduction in distance measurement accuracy can be decreased, for example, even when an object at a short distance and an object at a long distance are present in the distance measurement range AR.

Other configuration, operation, and effects may be similar to those in the foregoing embodiments and will not be further elaborated here.

4. Fourth Embodiment

In the foregoing embodiments, the computing unit 15 implemented in the ToF sensor 1 includes the sampling circuit 151, the histogram circuit 152, the filter circuit 153, the echo detecting circuit 154, and the register block 155. However, a part of the sampling circuit 151, the histogram circuit 152, the filter circuit 153, and the echo detecting circuit 154 may be implemented, for example, in an external device such as the host 80.

4.1 First Example

Figure 23:
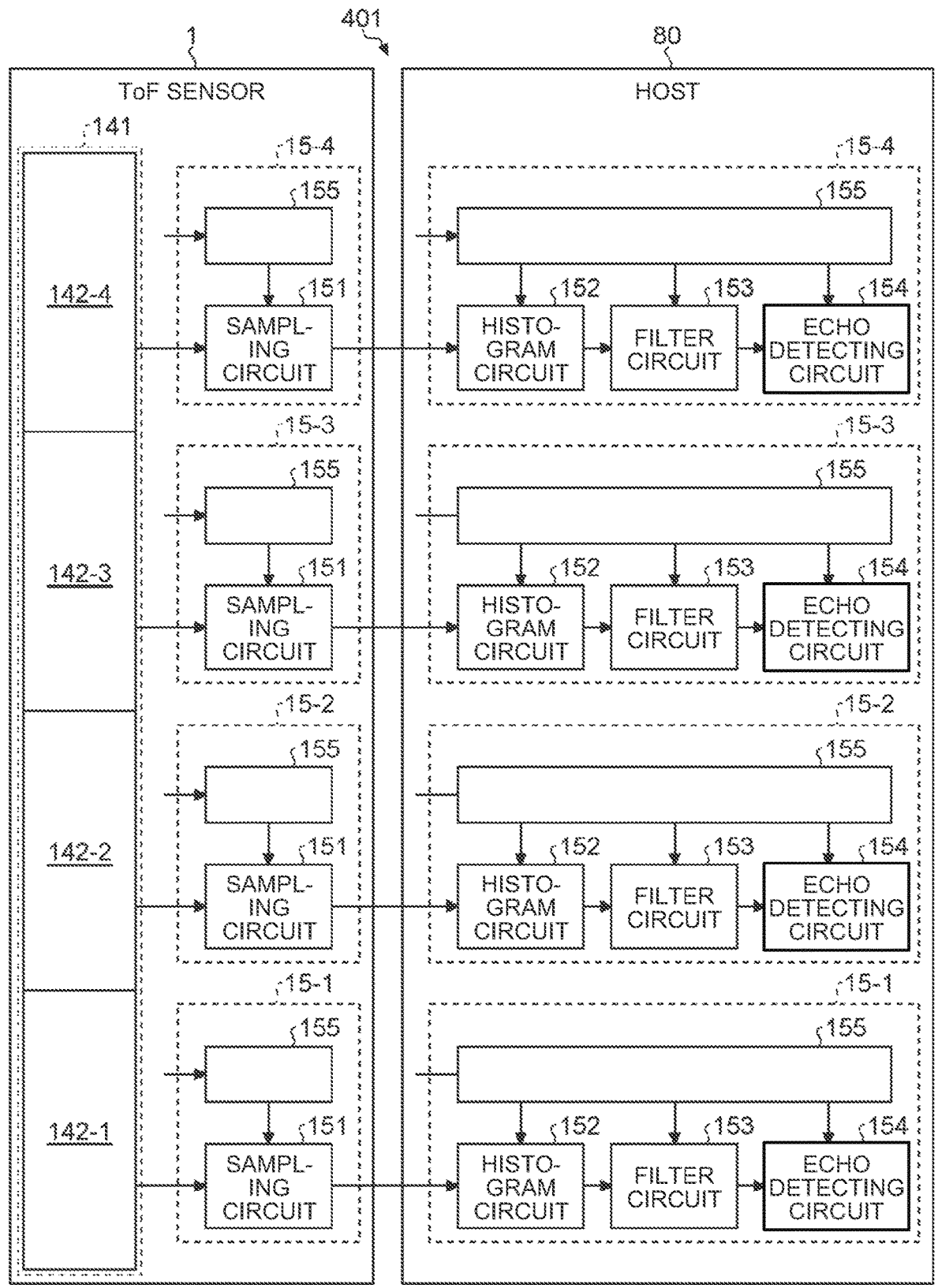
FIG. 23 is a diagram illustrating an overall configuration example of a distance measuring system according to a first example of a fourth embodiment.

For example, in a distance measurement system 401 illustrated in FIG. 23, the histogram circuit 152, the filter circuit 153, and the echo detecting circuit 154 in each of the computing units 15-1 to 15-4 of the ToF sensor 1, and a part of the register block 155 may be implemented in the host 80, and the sampling circuit 151 and the register block 155 thereof may be implemented in each of the computing units 15-1 to 15-4 of the ToF sensor 1.

4.2 Second Example

Figure 24:
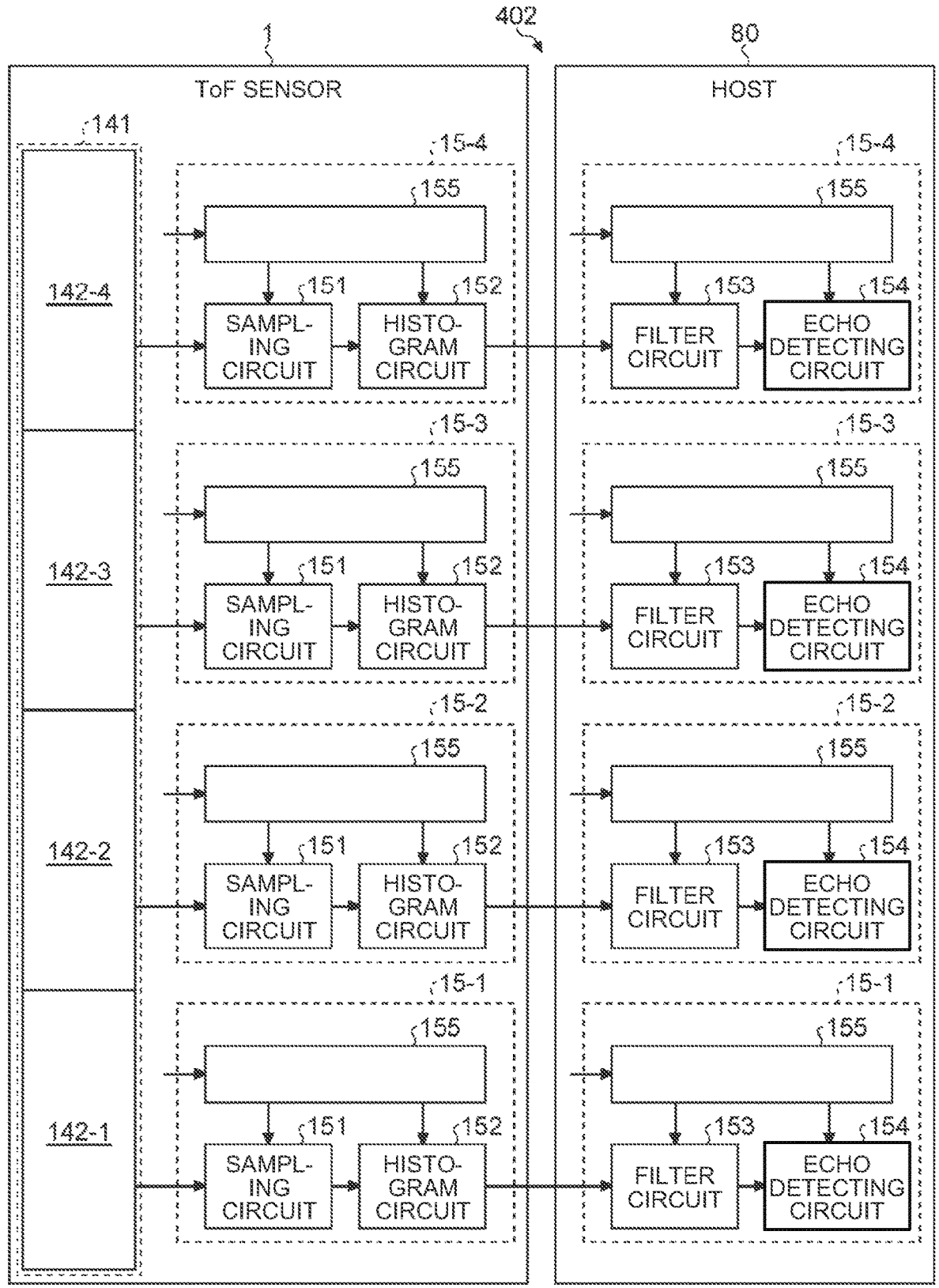
FIG. 24 is a diagram illustrating an overall configuration example of the distance measuring system according to a second example of the fourth embodiment.

For example, in a distance measurement system 402 illustrated in FIG. 24, the filter circuit 153 and the echo detecting circuit 154 in each of the computing units 15-1 to 15-4 of the ToF sensor 1, and a part of the register block 155 may be implemented in the host 80, and the sampling circuit 151 and the histogram circuit 152 and the register block 155 thereof may be implemented in each of the computing units 15-1 to 15-4 of the ToF sensor 1.

4.3 Third Example

Figure 25:
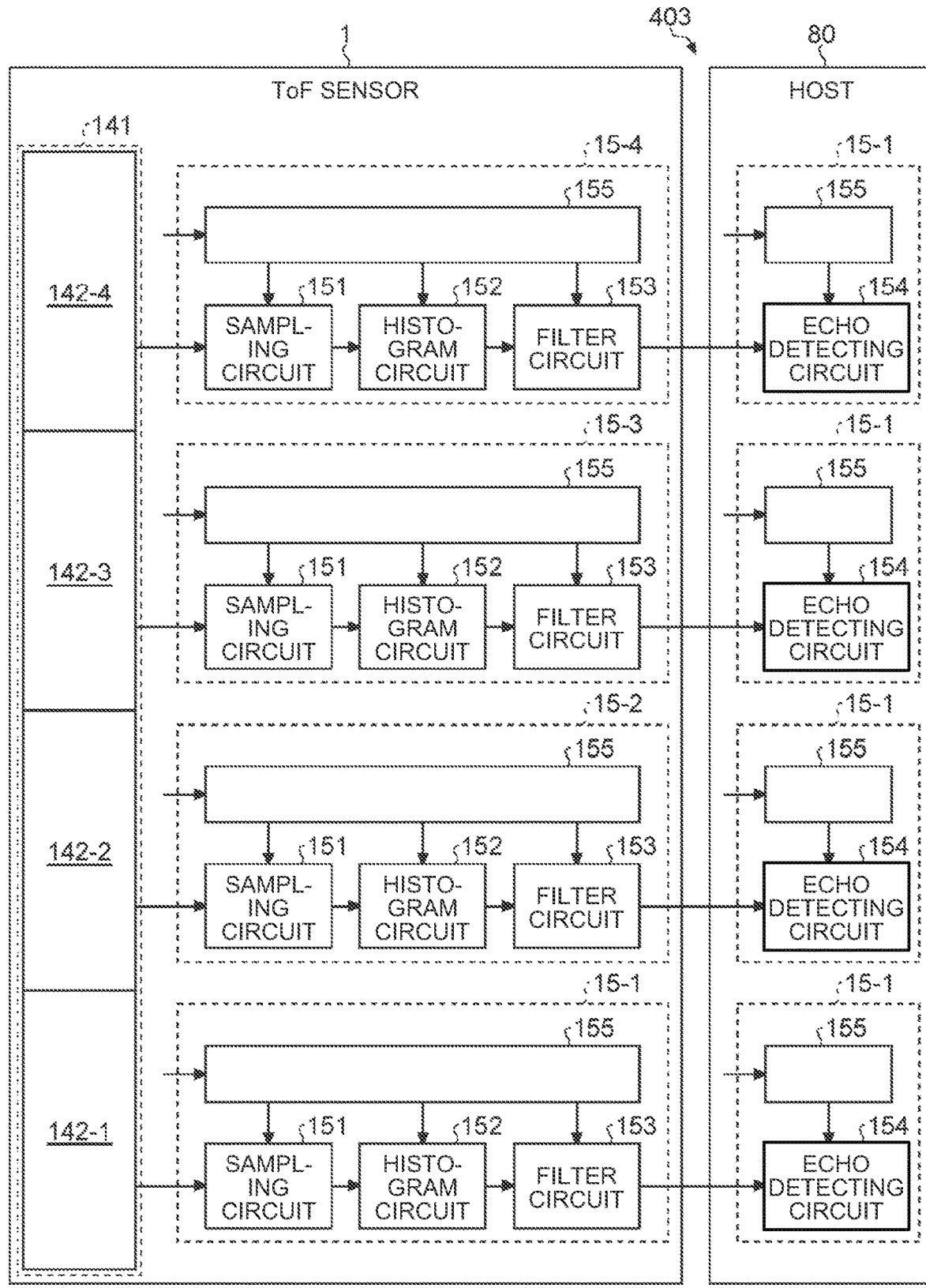
FIG. 25 is a diagram illustrating an overall configuration example of the distance measuring system according to a third example of the fourth embodiment.

For example, in a distance measurement system 404 illustrated in FIG. 25, the echo detecting circuit 154 and the register block 155 thereof in each of the computing units 15-1 to 15-4 of the ToF sensor 1 may be implemented in the host 80, and the sampling circuit 151, the histogram circuit 152, and the filter circuit 153, and the register block 155 thereof may be implemented in each of the computing units 15-1 to 15-4 of the ToF sensor 1.

4.4 Operation and Effects

Even with such a configuration, the distance to an object can be calculated using an optimal computation coefficient for each region in the same manner as in the first embodiment, so that reduction in distance measurement accuracy can be decreased, for example, even when an object at a short distance and an object at a long distance are present in the distance measurement range AR.

It should be noted that a partial configuration in the ToF sensor 1 is omitted in FIG. 23 to FIG. 25, for simplicity of explanation. Furthermore, although the present embodiment is based on the first embodiment, the present embodiment may be based on an embodiment other than the first embodiment.

Other configuration, operation, and effects may be similar to those in the foregoing embodiments and will not be further elaborated here.

5. Fifth Embodiment

A fifth embodiment will now be described in detail below with reference to the drawings. In the fifth embodiment, the ToF sensor 1 according to the foregoing embodiments mounted on a vehicle equipped with an autonomous driving function will be described with an example. In the following description, the ToF sensor 1 according to the first embodiment is used as an example. However, the present invention is not limited thereto and the ToF sensor 1 according to any other embodiments may be used.

5.1 Vehicle-Mounted System

Figure 26:
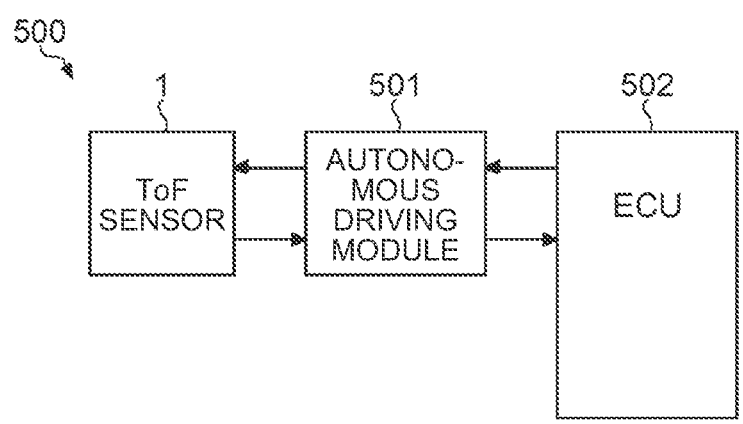
FIG. 26 is a block diagram illustrating an overall configuration example of a vehicle-mounted system according to a fifth embodiment.

FIG. 26 is a block diagram illustrating an overall configuration example of a vehicle-mounted system according to the present embodiment. As illustrated in FIG. 26, a vehicle-mounted system 500 includes, for example, the ToF sensor 1, an autonomous driving module 501, and an engine control unit (ECU) 502.

The ECU 502 includes, for example, a central processing unit (CPU), a read-only memory (ROM), a random access memory (RAM), a display controller, a sound controller, and a solid state drive (SSD, flash memory), which are not illustrated, and executes a variety of control on vehicle driving, vehicle interior environment, and the like. The ECU 502 provides the autonomous driving module 501 with a variety of information on vehicle driving, vehicle interior environment, and the like.

The autonomous driving module 501 executes, for example, a variety of processes for autonomously controlling vehicle driving based on the distance measurement result from the ToF sensor 1, based on a variety of information on vehicle driving, vehicle interior environment, and the like provided from the ECU 502.

The autonomous driving module 501 also inputs to the ToF sensor 1 the computation coefficients 16-1 to 16-4 to be set in each of the computing units 15-1 to 15-4 of the ToF sensor 1, based on a variety of information on vehicle driving, vehicle interior environment, and the like provided from the ECU 502. This autonomous driving module 501 corresponds to, for example, the host 80 in the foregoing embodiments.

5.2 Computation Coefficient Switching Operation

The operation of switching the computation coefficients in a computation process in the ToF sensor 1 in the vehicle-mounted system 500 as illustrated in FIG. 26 will now be described with an example. The present description will focus on the operation of the autonomous driving module 501.

Figure 27:
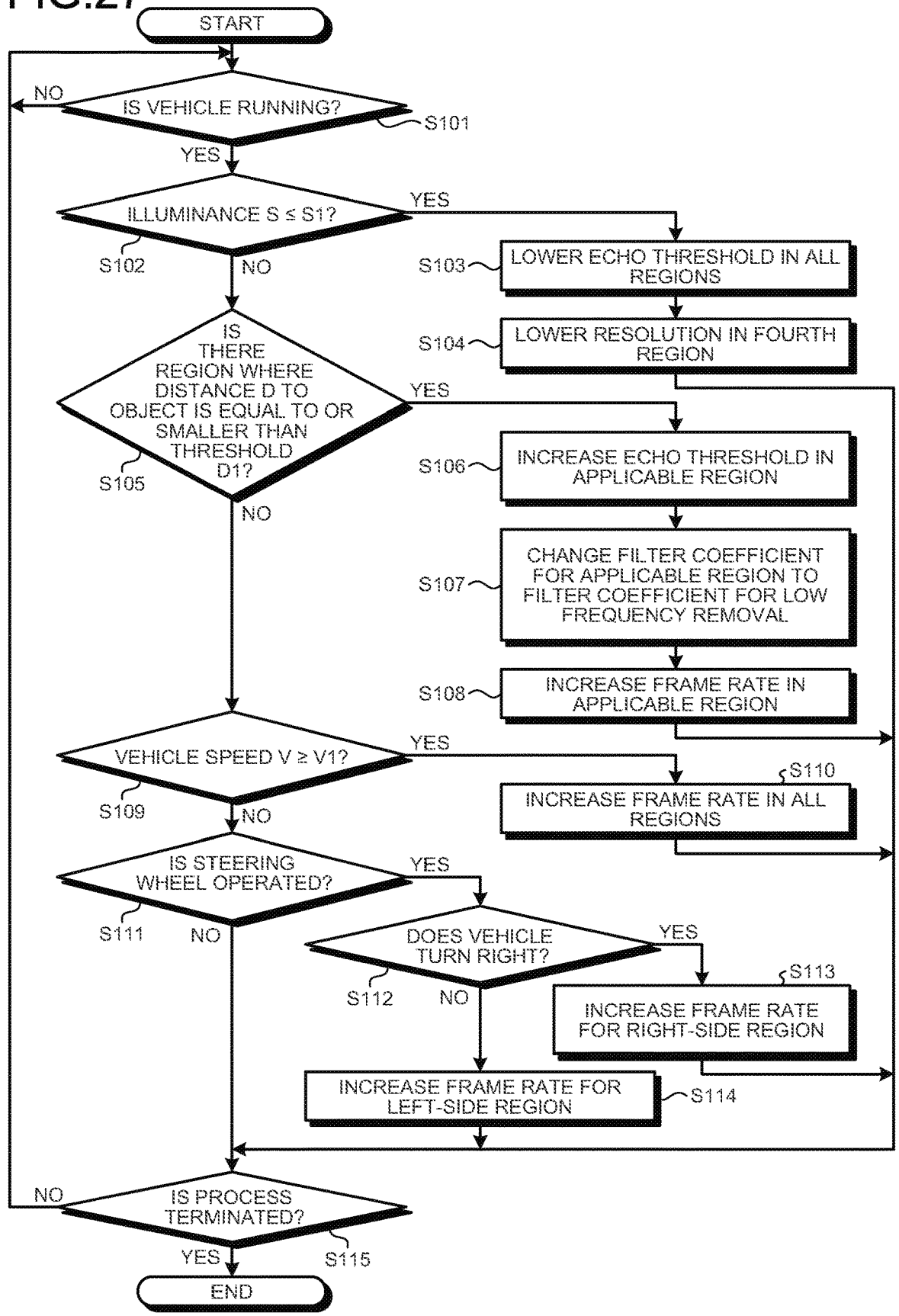
FIG. 27 is a flowchart illustrating an overall example of a computation coefficient switching operation according to the fifth embodiment.

FIG. 27 is a flowchart illustrating an overall example of the computation coefficient switching operation according to the present embodiment. As illustrated in FIG. 27, in this operation, upon start-up, the autonomous driving module 501 determines whether the vehicle is driven, in accordance with information provided from the ECU 502 (step S101) and waits until the vehicle starts driving (No at step S101).

When the vehicle starts driving (Yes at step S101), the autonomous driving module 501 first determines whether illuminance S outside the vehicle at present detected, for example, by a not-illustrated illuminance sensor is equal to or smaller than an illuminance threshold S1 (step S102). If the illuminance S is larger than the illuminance threshold S1 (No at step S102), the autonomous driving module 501 proceeds to step S105. On the other hand, if the illuminance S is equal to or smaller than the illuminance threshold S1 (Yes at step S102), the autonomous driving module 501 changes the computation coefficients 16-1 to 16-4 such that the echo thresholds for all of the first region 50-1 to the fourth region 50-4 are lowered (step S103) and, for example, changes the computation coefficient 16-4 such that the resolution of the fourth region 50-4 is increased (step S104), and thereafter proceeds to step S115.

At step S102, in place of comparison between the illuminance S at present and the illuminance threshold S1, for example, it may be determined whether it is in a certain time range (mainly at night). The rate of decrease in echo threshold at step S103 may be preset or may be the rate of decrease in accordance with the illuminance S at present. Furthermore, the rate of decrease in resolution at step S104 may be preset or may be the rate of decrease in accordance with the illuminance S at present. Furthermore, the region in which the resolution is reduced at step S104 is not limited to the fourth region 50-4 and may be added or changed in various ways, for example, may be the third region 50-3.

At step S105, the autonomous driving module 501 determines whether, among the first region 50-1 to the fourth region 50-4, there is a region where the distance D from the vehicle or the ToF sensor 1 to an object present in the distance measurement range AR of the ToF sensor 1 is equal to or smaller than a distance threshold D1. If there exists no region where the distance D is equal to or smaller than the distance threshold D1 (No at step S105), the autonomous driving module 501 proceeds to step S109. On the other hand, if there exists a region where the distance D is equal to or smaller than the distance threshold D1 (Yes at step S105), the autonomous driving module 501 increases the echo threshold of the applicable region (step S106), changes the filter coefficient for the same applicable region to a filter coefficient for low frequency removal (step S107), increases the frame rate of the applicable region (step S108), and thereafter proceeds to step S115.

At step S106, the distance D to an object may be calculated based on an image acquired by a not-illustrated image sensor or the like, rather than the previous frame acquired by the ToF sensor 1. The rate of increase in echo threshold at step S106 may be preset or may be the rate of increase in accordance with the distance D at present. Furthermore, at step S107, the frequency band to be removed after change may be a preset frequency band or may be a frequency band in accordance with the distance D at present. Furthermore, the rate of increase in frame rate at step S108, the rate of increase in echo threshold at step S106 may be preset or may be the rate of increase in accordance with the distance D at present.

At step S109, the autonomous driving module 501 determines whether the vehicle speed V at present is equal to or larger than a speed threshold V1, in accordance with the information provided from the ECU 502. If the vehicle speed V is smaller than the speed threshold V1 (No at step S109), the autonomous driving module 501 proceeds to step S111. On the other hand, if the vehicle speed V is equal to or larger than the speed threshold V1 (Yes at step S109), the autonomous driving module 501 increases the frame rate in all of the regions (step S110) and thereafter proceeds to step S115.

The rate of increase in frame rate at step S110, the rate of increase in echo threshold at step S106 may be preset or may be the rate of increase in accordance with the vehicle speed V at present.

At step S111, the autonomous driving module 501 determines whether the steering wheel is operated manually or automatically by a certain turn angle or more, in accordance with the information provided from the ECU 502. If the steering operation by a certain turn angle or more is not performed (No at step S111), the autonomous driving module 501 proceeds to step S115. On the other hand, if the steering operation by a certain turn angle or more is performed (Yes at step S111), the autonomous driving module 501 determines whether the vehicle turns right, based on the amount of steering operation (step S112). If the vehicle turns right (Yes at step S112), the autonomous driving module 501 increases the frame rate for a right-side region in the distance measurement region AR (step S113) and thereafter proceeds to step S115. On the other hand, if the vehicle does not turn right, that is, turns left (No at step S112), the autonomous driving module 501 increases the frame rate for a left-side region in the distance measurement region AR (step S114) and thereafter proceeds to step S115.

At step S115, the autonomous driving module 501 determines whether to terminate the operation, for example, in accordance with an instruction from the ECU 502 and, if to terminate (Yes at step S115), terminates the operation. On the other hand, if not to terminate (No at step S115), the autonomous driving module 501 returns to step S101 and continuously performs the subsequent operation.

5.3 Operation and Effects

As described above, according to the present embodiment, the computation coefficient for each region can be changed in accordance with a vehicle driving state, a vehicle exterior circumstance, and the like. This operation enables optimal distance measurement in accordance with a vehicle driving state, a vehicle exterior circumstance, and the like.

Other configuration, operation, and effects may be similar to those in the foregoing embodiments and will not be further elaborated here.

6. Application Examples

The technique according to the present disclosure is applicable to various products. For example, the technique according to the present disclosure may be implemented as a device mounted on any kinds of moving bodies including automobiles, electric vehicles, hybrid electric vehicles, motorcycles, bicycles, personal mobility devices, aircrafts, drones, ships, robots, construction machines, and agricultural machines (e.g., tractors).

Figure 28:
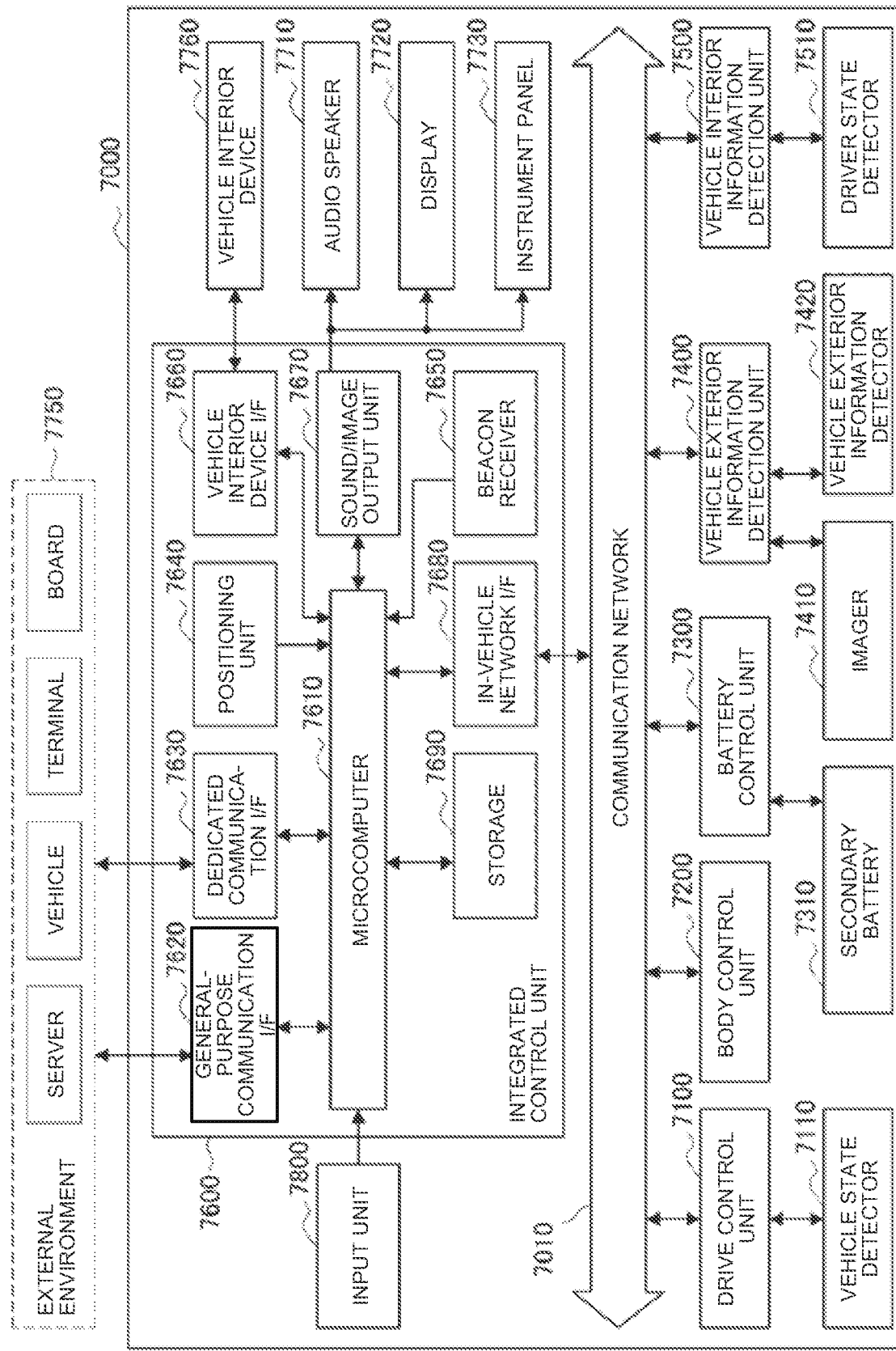
FIG. 28 is a block diagram illustrating an example of the overall configuration of a vehicle control system.

FIG. 28 is a block diagram illustrating an overall configuration example of a vehicle control system 7000, which is an example of a moving body control system to which the technique according to the present disclosure may be applied. The vehicle control system 7000 includes a plurality of electronic control units connected through a communication network 7010. In the example illustrated in FIG. 28, the vehicle control system 7000 includes a drive control unit 7100, a body control unit 7200, a battery control unit 7300, a vehicle exterior information detection unit 7400, a vehicle interior information detection unit 7500, and an integrated control unit 7600. The communication network 7010 connecting these control units may be, for example, an in-vehicle communication network compliant with any standards, such as Controller Area Network (CAN), Local Interconnect Network (LIN), local area network (LAN), or FlexRay (registered trademark).

Each control unit includes a microcomputer that performs a computation process under instructions of a variety of computer programs, a storage that stores a computer program executed by the microcomputer or parameters for use in a variety of computation, and a drive circuit that drives a variety of devices to be controlled. Each control unit includes a network I/F for communicating with another control unit through the communication network 7010 and includes a communication I/F for communicating with a vehicle interior or exterior device or a sensor via wired communication or wireless communication. FIG. 28 illustrates, as the functional configuration of the integrated control unit 7600, a microcomputer 7610, a general-purpose communication I/F 7620, a dedicated communication I/F 7630, a positioning unit 7640, a beacon receiver 7650, a vehicle interior device I/F 7660, a sound/image output unit 7670, an in-vehicle network I/F 7680, and a storage 7690. Similarly, the other control units each include a microcomputer, a communication I/F, a storage, and the like.

The drive control unit 7100 controls the operation of a device related to the drive system of the vehicle under instructions of a variety of computer programs. For example, the drive control unit 7100 functions as a control device for a drive force generating device for generating drive force of the vehicle, such as an internal combustion engine or a drive motor, a drive force transmission mechanism for transmitting drive force to the wheels, a steering mechanism for adjusting the steering angle of the vehicle, a braking device for generating braking force of the vehicle, and the like. The drive control unit 7100 may have the function as a control device such as antilock brake system (ABS) or electronic stability control (ESC).

A vehicle state detector 7110 is connected to the drive control unit 7100. The vehicle state detector 7110 includes, for example, at least one of a gyro sensor detecting the angular velocity of axial rotational motion of the vehicle body, an acceleration sensor detecting the acceleration of the vehicle, and sensors detecting the operation amount of the accelerator pedal, the operation amount of the brake pedal, the steering angle of the steering wheel, the engine speed, or the rotational speed of the wheels. The drive control unit 7100 performs a computation process using a signal input from the vehicle state detector 7110 and controls the internal combustion engine, the drive motor, the electric power steering device, the braking device, and the like.

The body control unit 7200 controls the operation of a variety of devices installed in the vehicle body, under instructions of a variety of computer programs. For example, the body control unit 7200 functions as a control device for a keyless entry system, a smart key system, a power window device, or a variety of lamps such as headlamps, rear lamps, brake lights, direction indicators, and fog lamps. In this case, the body control unit 7200 may receive radio waves transmitted from a mobile device as an alternative to a key or a signal from a variety of switches. The body control unit 7200 accepts input of the radio waves or the signal and controls a door lock device, the power window device, the lamps, and the like of the vehicle.

The battery control unit 7300 controls a secondary battery 7310 serving as a power supply source for the drive motor, under instructions of a variety of computer programs. For example, the battery control unit 7300 receives information such as battery temperature, battery output voltage, or battery remaining capacity from the battery device including the secondary battery 7310. The battery control unit 7300 performs a computation process using these signals and performs temperature regulation control for the secondary battery 7310 or controls a cooler in the battery device.

The vehicle exterior information detection unit 7400 detects information on the outside of the vehicle equipped with the vehicle control system 7000. For example, at least one of an imager 7410 and a vehicle exterior information detector 7420 is connected to the vehicle exterior information detection unit 7400. The imager 7410 includes at least one of a time of flight (ToF) camera, a stereo camera, a monocular camera, an infrared camera, and other cameras. The vehicle exterior information detector 7420 includes, for example, at least one of an environment sensor detecting the current weather or atmospheric conditions and a surrounding information detecting sensor detecting other vehicles, obstacles, or pedestrians around the vehicle equipped with the vehicle control system 7000.

The environment sensor may be, for example, at least one of a raindrop sensor detecting rain, a fog sensor detecting fog, a sunshine sensor detecting the degree of sunshine, and a snow sensor detecting snowfall. The surrounding information detecting sensor may be at least one of an ultrasonic sensor, a radar device, and a light detection and ranging or laser imaging detection and ranging (LIDAR) device. The imager 7410 and the vehicle exterior information detector 7420 may be provided as independent sensors or devices or may be provided as an integrated device including a plurality of sensors or devices.

Figure 29:
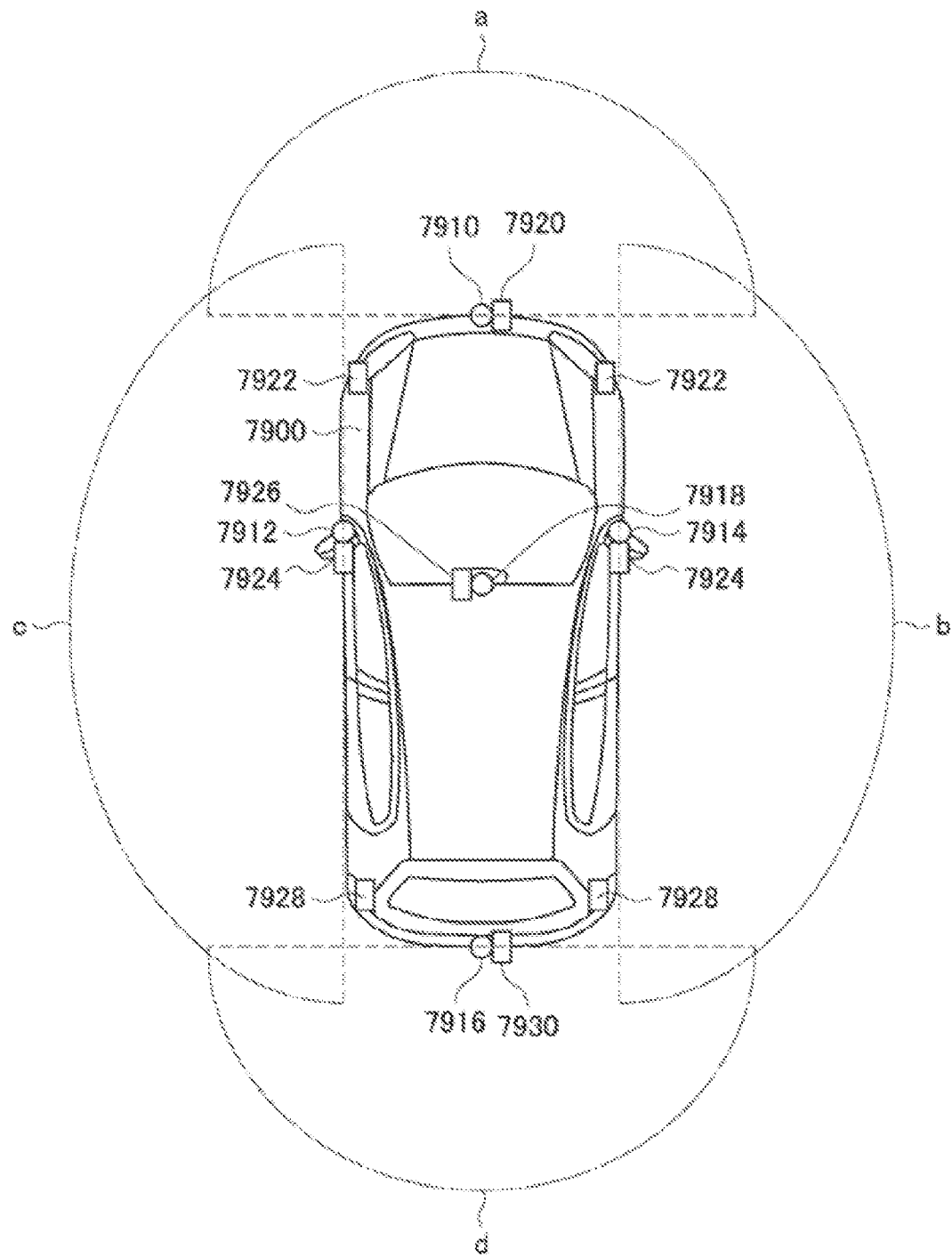
FIG. 29 is a diagram illustrating an example of the installation positions of a vehicle exterior information detector and an imager.

FIG. 29 illustrates an example of the installation positions of the imager 7410 and the vehicle exterior information detector 7420. Imagers 7910, 7912, 7914, 7916, and 7918 are provided, for example, at least one of locations including the front nose, the side mirrors, the rear bumper, the back door, and an upper part of the vehicle interior windshield of a vehicle 7900. The imager 7910 provided at the front nose and the imager 7918 provided at an upper part of the vehicle interior windshield mainly acquire an image in front of the vehicle 7900. The imagers 7912 and 7914 provided at the side mirrors mainly acquire images on the sides of the vehicle 7900. The imager 7916 provided at the rear bumper or the back door mainly acquires an image behind the vehicle 7900. The imager 7918 provided at an upper part of the vehicle interior windshield is mainly used to detect a vehicle ahead or a pedestrian, an obstacle, a traffic light, a traffic sign, a traffic lane, and the like.

FIG. 29 illustrates an example of the respective imaging ranges of the imagers 7910, 7912, 7914, and 7916. An imaging range a indicates the imaging range of the imager 7910 provided at the front nose, imaging ranges b and c indicate the respective imaging ranges of the imagers 7912 and 7914 provided at the side mirrors, and an imaging range d indicates the imaging range of the imager 7916 provided at the rear bumper or the back door. For example, image data captured by the imagers 7910, 7912, 7914, and 7916 are superimposed to obtain a bird's-eye view image of the vehicle 7900 viewed from above.

Vehicle exterior information detectors 7920, 7922, 7924, 7926, 7928, and 7930 provided at the front, the rear, the sides, the corners, and the upper part of the vehicle interior windshield of the vehicle 7900 may be, for example, ultrasonic sensors or radar devices. The vehicle exterior information detectors 7920, 7926, and 7930 provided at the front nose, the rear bumper, the back door, and the upper part of the vehicle interior windshield of the vehicle 7900 may be, for example, LIDAR devices. These vehicle exterior information detectors 7920 to 7930 are mainly used to detect a vehicle ahead, a pedestrian, an obstacle, and the like.

Returning to FIG. 28, the description will continue. The vehicle exterior information detection unit 7400 allows the imager 7410 to capture a vehicle exterior image and receives the captured image data. The vehicle exterior information detection unit 7400 also receives detected information from the vehicle exterior information detector 7420 connected thereto. When the vehicle exterior information detector 7420 is an ultrasonic sensor, a radar device, or a LIDAR device, the vehicle exterior information detection unit 7400 allows emission of ultrasound waves or electromagnetic waves and receives information on the received reflected waves. The vehicle exterior information detection unit 7400 may perform an object detection process or a distance detection process for persons, vehicles, signs, characters on a road surface, and the like, based on the received information. The vehicle exterior information detection unit 7400 may perform an environment recognition process of recognizing rain, fog, road surface condition, and the like, based on the received information. The vehicle exterior information detection unit 7400 may calculate the distance to an object outside the vehicle, based on the received information.

The vehicle exterior information detection unit 7400 may also perform an image recognition process of recognizing persons, vehicles, obstacles, signs, characters on a road surface, and the like, or a distance detection process, based on the received image data. The vehicle exterior information detection unit 7400 may perform a process such as distortion correction or alignment for the received image data and synthesize the image data captured by different imagers 7410 to generate a bird's-eye view image or a panorama image. The vehicle exterior information detection unit 7400 may perform a point-of-view conversion process using image data captured by different imagers 7410.

The vehicle interior information detection unit 7500 detects vehicle interior information. For example, a driver state detector 7510 detecting a state of the driver is connected to the vehicle interior information detection unit 7500. The driver state detector 7510 may include a camera capturing an image of the driver, a biometric sensor detecting biological information of the driver, or a microphone for collecting sound in the vehicle interior. The biometric sensor is provided, for example, at the seat or the steering wheel and detects biological information of a passenger sitting on the seat or the driver grabbing the steering wheel. The vehicle interior information detection unit 7500 may calculate the degree of fatigue or the degree of concentration of the driver or may determine whether the driver is falling asleep, based on detected information input from the driver state detector 7510. The vehicle interior information detection unit 7500 may perform a process such as a noise cancelling process for the collected sound signal.

The integrated control unit 7600 controls the overall operation in the vehicle control system 7000 under instructions of a variety of computer programs. An input unit 7800 is connected to the integrated control unit 7600. The input unit 7800 is implemented, for example, by a device capable of input operation by a passenger, such as a touch panel, a button, a microphone, a switch, or a lever. The integrated control unit 7600 may receive data obtained by speech recognition of voice input by the microphone. The input unit 7800 may be, for example, a remote controller using infrared rays or other radio waves or an externally connecting device, such as a mobile phone or a personal digital assistant (PDA) supporting the operation of the vehicle control system 7000. The input unit 7800 may be, for example, a camera, and in this case, the passenger can input information by gesture. Alternatively, data obtained by detecting a motion of a wearable device worn by a passenger may be input. In addition, the input unit 7800 may include, for example, an input control circuit that generates an input signal based on information input by the passenger or the like using the input unit 7800 described above and outputs the generated input signal to the integrated control unit 7600. The passenger or the like operates this input unit 7800 to input a variety of data or give an instruction for process operation to the vehicle control system 7000.

The storage 7690 may include a read-only memory (ROM) storing a variety of computer programs to be executed by the microcomputer and a random access memory (RAM) storing a variety of parameters, computation results, sensor values, and the like. Alternatively, the storage 7690 may be implemented, for example, by a magnetic storage device such as a hard disc drive (HDD), a semiconductor storage device, an optical storage device, or a magneto-optical storage device.

The general-purpose communication I/F 7620 is a general-purpose communication I/F that mediates communication with various devices residing in an external environment 7750. The general-purpose communication I/F 7620 may implement a cellular communication protocol such as Global System of Mobile communications (GSM) (registered trademark), WiMAX (registered trademark), Long Term Evolution (LTE) (registered trademark), or LTE-Advanced (LTE-A), or other wireless communication protocols such as wireless LAN (also called Wi-Fi (registered trademark)) and Bluetooth (registered trademark). The general-purpose communication I/F 7620 may connect, for example, to a device (for example, an application server or a control server) residing on an external network (for example, the Internet, a cloud network, or a network unique to a business operator) through a base station or an access point. The general-purpose communication I/F 7620 may also connect, for example, to a terminal residing near the vehicle (for example, a terminal of the driver, a pedestrian, or a store, or a Machine Type Communication (MTC) terminal), using peer-to-peer (P2P) technology.

The dedicated communication I/F 7630 is a communication I/F that supports a communication protocol formulated for use in vehicles. The dedicated communication I/F 7630 may implement, for example, a standard protocol such as wireless access in vehicle environment (WAVE), which is a combination of the lower layer IEEE 802.11p and the higher layer IEEE 1609, dedicated short range communications (DSRC), or a cellular communication protocol. The dedicated communication I/F 7630 typically carries out V2X communication which is a concept including at least one of vehicle-to-vehicle communication, vehicle-to-infrastructure communication, vehicle-to-home communication, and vehicle-to-pedestrian communication.

The positioning unit 7640, for example, receives global navigation satellite system (GNSS) signals from GNSS satellites (for example, global positioning system (GPS) signals from GPS satellites) to perform positioning and generates position information including the latitude, longitude, and altitude of the vehicle. The positioning unit 7640 may specify the present location by exchanging a signal with a wireless access point or may acquire position information from a terminal such as a mobile phone, a PHS, or a smart phone having the positioning function.

The beacon receiver 7650, for example, receives radio waves or electromagnetic waves transmitted from a radio station or the like installed on a road and acquires information such as the present location, traffic jam, road closure, or time required. The function of the beacon receiver 7650 may be included in the dedicated communication I/F 7630 described above.

The vehicle interior device I/F 7660 is a communication interface that mediates connection between the microcomputer 7610 and various vehicle interior devices 7760 residing in the vehicle. The vehicle interior device I/F 7660 may establish wireless communication using a wireless communication protocol such as a wireless LAN, Bluetooth (registered trademark), near field communication (NFC), or wireless USB (WUSB). The vehicle interior device I/F 7660 may also establish wired connection such as Universal Serial Bus (USB), High-Definition Multimedia Interface (HDMI) (registered trademark), or Mobile High-definition Link (MHL) through a not-illustrated connection terminal (and a cable, if necessary). The vehicle interior device 7760 may include, for example, at least one of a mobile device or a wearable device owned by a passenger or an information device carried into or attached to the vehicle. The vehicle interior device 7760 may also include a navigation device for searching for a route to a desired destination. The vehicle interior device I/F 7660 exchanges a control signal or a data signal with these vehicle interior devices 7760.

The in-vehicle network I/F 7680 is an interface that mediates communication between the microcomputer 7610 and the communication network 7010. The in-vehicle network I/F 7680 transmits and receives a signal and the like, in accordance with a predetermined protocol supported by the communication network 7010.

The microcomputer 7610 of the integrated control unit 7600 controls the vehicle control system 7000 under instructions of a variety of computer programs, based on information acquired through at least one of the general-purpose communication I/F 7620, the dedicated communication I/F 7630, the positioning unit 7640, the beacon receiver 7650, the vehicle interior device I/F 7660, and the in-vehicle network I/F 7680. For example, the microcomputer 7610 may compute a control target value for the drive force generating device, the steering mechanism, or the braking device, based on the acquired vehicle interior and exterior information, and output a control command to the drive control unit 7100. For example, the microcomputer 7610 may perform cooperative control for implementing the functions of advanced driver-assistance systems (ADAS), including vehicle collision avoidance or collision alleviation, headway control based on the distance between vehicles, cruise control, vehicle collision warning, or lane departure warning. The microcomputer 7610 may also perform cooperative control for autonomous driving that allows the vehicle to autonomously drive itself without the driver's operation, by controlling the drive force generating device, the steering mechanism, the braking device, and the like, based on the acquired vehicle surrounding information.

The microcomputer 7610 may generate three-dimensional distance information between the vehicle and an object such as a structure or a person in the surroundings, based on information acquired through at least one of the general-purpose communication I/F 7620, the dedicated communication I/F 7630, the positioning unit 7640, the beacon receiver 7650, the vehicle interior device I/F 7660, and the in-vehicle network I/F 7680, and generate local map information including information on the surroundings around the present location of the vehicle. The microcomputer 7610 may also predict danger such as vehicle collision, approach to a pedestrian, or entry into a blocked road, based on the acquired information, and generate a warning signal. The warning signal may be, for example, a signal for producing warning sound or illuminating a warning lamp.

The sound/image output unit 7670 transmits an output signal of at least one of sound or image to an output device capable of visually or aurally providing information to a passenger in the vehicle or the outside of the vehicle. In the example in FIG. 28, an audio speaker 7710, a display 7720, and an instrument panel 7730 are illustrated as the output device. The display 7720 may include, for example, at least one of an on-board display and a head-up display. The display 7720 may have an augmented reality (AR) display function. The output device may be a device other than those devices, such as a headset, a wearable device such as an eyeglasses-type display worn by a passenger, a projector, or a lamp. When the output device is a display device, the display device visually presents the result obtained by a variety of processes performed by the microcomputer 7610 or information received from other control units, in various forms such as text, image, table, and graph. When the output device is a sound output device, the sound output device converts an audio signal of reproduced sound data or acoustic data into an analog signal and aurally outputs the analog signal.

In the example illustrated in FIG. 28, at least two control units connected through the communication network 7010 may be integrated as one control unit. Alternatively, each individual control unit may be configured with a plurality of control units. Furthermore, the vehicle control system 7000 may include not-illustrated another control unit. In the foregoing description, a part or the whole of the functions served by any of the control units may be allocated to another control unit. That is, as long as information is transmitted and received through the communication network 7010, a predetermined computation process may be performed by any control unit. Similarly, a sensor or a device connected to any of the control units may be connected to another control unit, and a plurality of control units may mutually transmit and receive the detected information through the communication network 7010.

A computer program for implementing the functions of the ToF sensor 1 according to the present embodiment illustrated in FIG. 1 may be implemented in any of the control units. A computer-readable recording medium storing such a computer program may be provided. Examples of the recording medium include a magnetic disk, an optical disk, a magneto-optical disk, and a flash memory. The foregoing computer program may be distributed, for example, via a network, rather than on the recording medium.

In the vehicle control system 7000 described above, the ToF sensor 1 according to the present embodiment illustrated in FIG. 1 may be applied to the integrated control unit 7600 in the application example illustrated in FIG. 28. For example, the control unit 11, the computing unit 15, and the external I/F 19 of the ToF sensor 1 correspond to the microcomputer 7610, the storage 7690, and the in-vehicle network I/F 7680 of the integrated control unit 7600. However, the present invention is not limited thereto and the vehicle control system 7000 may correspond to the host 80 in FIG. 1.

At least some of the constituent elements of the ToF sensor 1 according to the present embodiment illustrated in FIG. 1 may be implemented in a module (for example, an integrated circuit module formed in one die) for the integrated control unit 7600 illustrated in FIG. 28. Alternatively, the ToF sensor 1 according to the present embodiment illustrated in FIG. 1 may be implemented by a plurality of control units of the vehicle control system 7000 illustrated in FIG. 28.

Although embodiments of the present disclosure have been described above, the technical scope of the present disclosure is not limited to these embodiments and susceptible to various modifications without departing from the spirit of the present disclosure. Constituent elements in different embodiments and modifications may be combined as appropriate.

The effects in the embodiments provided in the present description are only illustrative and not intended to be limitative and may include any other effects.

The present technique may have the following configuration.

(1)

A distance measuring device comprising:
- an array in which a plurality of light-receiving elements are arranged, each of the light-receiving elements being configured to detect incidence of a photon;
- a read circuit configured to read a detection signal from each of the light-receiving elements; and
- a plurality of computing units configured to generate depth information on a distance to an object present in an angle of view in different regions in the array, based on the detection signals read from the light-receiving elements belonging to the different regions, wherein
- the computing units generate the depth information using computation coefficients at least partially different from each other.

(2)

The distance measuring device according to (1), wherein each of the computing units includes a sampling circuit configured to aggregate the number of the detection signals read in a predetermined sampling period from the light-receiving elements, in units of pixels including one or more of the light-receiving elements, and generate pixel values of the pixels for each sampling period.

(3)

The distance measuring device according to (2), wherein each of the computing units further includes a histogram circuit configured to generate, for each of the pixels, a histogram of the pixel value for each sampling period aggregated by the sampling circuit.

(4)

The distance measuring device according to (3), wherein each of the computing units further includes a filter circuit configured to remove a noise component from the histogram for each of the pixels generated by the histogram circuit.

(5)

The distance measuring device according to (4), wherein each of the computing units further includes an echo detecting circuit configured to extract a certain optical component from the histogram from which a noise component has been removed by the filter circuit.

(6)

The distance measuring device according to (5), wherein each of the computation coefficients includes at least one of a threshold with which the echo detecting circuit extracts the certain optical component from the histogram, a filter coefficient with which the filter circuit removes a noise component from the histogram, a resolution determining the number of the light-receiving elements that are included in one pixel by the sampling circuit, a frame rate at which the depth information is read from the array, and an output range indicating a range of output in the histogram.

(7)

The distance measuring device according to (5), wherein
the array includes a first region and a second region different from the first region,
the computing units include a first computing unit and a second computing unit, the first computing unit being configured to generate the depth information on a distance to an object present in an angle of view in the first region based on the detection signal read from the light-receiving element belonging to the first region, the second computing unit being configured to generate the depth information on a distance to an object present in an angle of view in the second region based on the detection signal read from the light-receiving element belonging to the second region,
the computation coefficient includes a threshold with which the echo detecting circuit extracts the certain optical component from the histogram, and
the threshold in the computation coefficient set in the first computing unit is a value higher than the threshold in the computation coefficient set in the second computing unit.

(8)

The distance measuring device according to (5), wherein
the array includes a first region and a second region different from the first region,
the computing units include a first computing unit and a second computing unit, the first computing unit configured to generate the depth information on a distance to an object present in an angle of view in the first region based on the detection signal read from the light-receiving element belonging to the first region, the second computing unit configured to generate the depth information on a distance to an object present in an angle of view in the second region based on the detection signal read from the light-receiving element belonging to the second region,
the computation coefficient includes a filter coefficient with which the filter circuit removes a noise component from the histogram, and
the filter coefficient in the computation coefficient set in the first computing unit is a filter coefficient that removes a frequency component lower than the filter coefficient in the computation coefficient set in the second computing unit.

(9)

The distance measuring device according to any one of (1) to (8), wherein
the array is partitioned into a plurality of regions arranged in a row, and
the computing units correspond one-to-one to the regions.

(10)

The distance measuring device according to any one of (1) to (9), wherein each of the computing units includes a register block configured to store an individual computation coefficient to be used to generate the depth information.

(11)

The distance measuring device according to any one of (1) to (9), further comprising a common register block configured to store an individual computation coefficient set for each of the computing units.

(12)

The distance measuring device according to any one of (1) to (12), further comprising:
a first chip including the array; and
a second chip including the read circuit and the computing units, wherein
the first chip and the second chip laminated each other form a stack chip, and
in the second chip, the computing units are disposed in parallel with the read circuit.

(13)

The distance measuring device according to (12), wherein each of the computing units includes
a sampling circuit configured to aggregate the number of the detection signals read in a predetermined sampling period from the light-receiving elements, in units of pixels including one or more of the light-receiving elements, and generate pixel values of the pixels for each sampling period,
a histogram circuit configured to generate, for each of the pixels, a histogram of the pixel value for each sampling period aggregated by the sampling circuit,
a filter circuit configured to remove a noise component from the histogram for each of the pixels generated by the histogram circuit, and
an echo detecting circuit configured to extract a certain optical component from the histogram from which a noise component has been removed by the filter circuit, and
in each of the computing units, the sampling circuit, the histogram circuit, the filter circuit, and the echo detecting circuit are disposed in order of the sampling circuit, the histogram circuit, the filter circuit, and the echo detecting circuit, from a side close to the read circuit.

(14)

The distance measuring device according to any one of (1) to (13), further comprising an optical system configured to scan an angle of view in the array at predetermined intervals in a predetermined direction.

(15)

The distance measuring device according to any one of (1) to (15), further comprising a light-emitting unit configured to output laser light having a predetermined wavelength at predetermined emission intervals, wherein each of the light-receiving element detects reflected light of the laser light.

(16) A vehicle-mounted system comprising:

the distance measuring device according to any one of (1) to (15);

a module configured to input the computation coefficient to the distance measuring device; and a control unit configured to provide the module with information on vehicle driving and/or vehicle interior environment, wherein the module changes the computation coefficient to be input to the distance measuring device, based on the information on the vehicle driving and/or the vehicle interior environment provided from the control unit.

(17) A distance measuring method comprising:

a read step of reading a detection signal from each of a plurality of light-receiving elements, each of the light-receiving elements being configured to detect incidence of a photon; and a computation step of generating depth information on a distance to an object present in an angle of view in different regions, based on the detection signals read from the light-receiving elements belonging to the different regions, wherein the computation step generates the respective depth information in the different regions using computation coefficients at least partially different from each other.

REFERENCE SIGNS LIST

1 ToF sensor
11 control unit
13 light-emitting unit
131 light source
132 collimator lens
133 half mirror
134 driver
135 galvano mirror
14 light-receiving unit
141 SPAD array
142 use SPAD array
142-1 to 142-4 SPAD region
143 timing control circuit
144 drive circuit
145 output circuit
146 light-receiving lens
15, 15-1 to 15-4, 25-1 to 25-4, 35-1 to 35-4 computing unit
16-1 to 16-4 computation coefficient
17-1 to 17-4 distance measurement result
19 external I/F
20 SPAD pixel
21 photodiode
22 read circuit
22A read circuit region
23 quench resistor
24 select transistor
25 digital converter
251 resistor
252 NMOS transistor
26 inverter
261 PMOS transistor
262 NMOS transistor
27 buffer
30 macro-pixel
40 SPAD adder
41 pulse shaper
42 light reception counter
50 depth image
50-1 to 50-4 first region to fourth region
51-1 to 51-4 frame image
80 host
90 object
100 laminated chip
101 light-receiving chip
102 circuit chip
120 effective pixel region
151, 351 sampling circuit
152, 352 histogram circuit
153, 353 filter circuit
154, 354 echo detecting circuit
155, 155-1 to 155-4, 255 register block
156-1 to 156-4 parameter setter
156-5 broadcast parameter setter
401 to 403 distance measurement system
500 vehicle-mounted system
501 autonomous driving module
502 ECU
AR distance measurement region
H1 horizontal line
L1 laser light
L2 reflected light
LD pixel drive line
LS output signal line
SR angle of view

The invention claimed is:

1. A distance measuring device, comprising:

an array which comprises a plurality of light-receiving elements, wherein each of the plurality of light-receiving elements is configured to detect incidence of a photon;

a read circuit configured to read detection signals from the each of the plurality of light-receiving elements; and a plurality of computing units configured to generate first depth information on a first distance to a first object present in a first angle of view in different regions in the array, based on the detection signals read from the each of the plurality of light-receiving elements associated with the different regions, and a plurality of computation coefficients, wherein each of the plurality of computation coefficients is at least partially different.

2. The distance measuring device according to claim 1, wherein each of the plurality of computing units includes a sampling circuit, and the sampling circuit is configured to:

aggregate the detection signals read in a specific sampling period of a plurality of sampling periods from the plurality of light-receiving elements, in units of pixels including at least one light-receiving element of the plurality of light-receiving elements; and generate pixel values of the pixels for each sampling period of the plurality of sampling periods.

3. The distance measuring device according to claim 2, wherein the each of the plurality of computing units further includes a histogram circuit configured to generate, for each of the pixels, a histogram of the pixel values for the each sampling period.

4. The distance measuring device according to claim 3, wherein the each of the plurality of computing units further includes a filter circuit configured to remove a noise component from the histogram for the each of the pixels.

5. The distance measuring device according to claim 4, wherein the each of the plurality of computing units further includes an echo detecting circuit configured to extract an optical component from the histogram from which the noise component is removed.

6. The distance measuring device according to claim 5, wherein each of the plurality of computation coefficients includes at least one of
 a threshold with which the echo detecting circuit is configured to extract the optical component from the histogram,
 a filter coefficient with which the filter circuit is configured to remove the noise component from the histogram,
 a resolution to determine the aggregated detection signals from the plurality of light-receiving elements that are included in a specific pixel of the pixels by the sampling circuit,
 a frame rate at which the first depth information is read from the array, or
 an output range that indicates range of output in the histogram.

7. The distance measuring device according to claim 5, wherein
 the array includes a first region and a second region,
 the second region is different from the first region,
 the plurality of computing units further includes a first computing unit and a second computing unit,
 the first computing unit is configured to generate second depth information on a second distance to a second object present in a second angle of view in the first region based on the detection signals read from a first light-receiving element of the plurality of light-receiving elements associated with the first region,
 the second computing unit is configured to generate third depth information on a third distance to third object present in a third angle of view in the second region based on the detection signals read from a second light-receiving element of the plurality of light-receiving elements associated with the second region,
 a specific computation coefficient of the plurality of computation coefficients includes a first threshold with which the echo detecting circuit extracts the optical component from the histogram, and
 a second threshold in a first computation coefficient set in the first computing unit is a value higher than a third threshold in a second computation coefficient set in the second computing unit.

8. The distance measuring device according to claim 5, wherein
 the array includes a first region and a second region,
 the second region is different from the first region,
 the plurality of computing units further includes a first computing unit and a second computing unit,
 the first computing unit configured to generate second depth information on a fourth distance to a fourth object present in a fourth angle of view in the first region based on the detection signals read from a first light-receiving element of the plurality of light-receiving elements associated with the first region,
 the second computing unit configured to generate third depth information on a fifth distance to a fifth object present in a fifth angle of view in the second region based on the detection signals read from a second light-receiving element of the plurality of light-receiving elements associated with the second region,
 the plurality of computation coefficients include a filter coefficient set with which the filter circuit removes the noise component from the histogram, and
 a first filter coefficient of the filter coefficient set in the plurality of computation coefficients in the first computing unit removes a frequency component lower in a value than a second filter coefficient in the plurality of computation coefficients in the second computing unit.

9. The distance measuring device according to claim 1, wherein
 the array is partitioned into a plurality of regions in a row, and
 the plurality of computing units corresponds one-to-one to the plurality of regions.

10. The distance measuring device according to claim 1, wherein
 each of the plurality of computing units includes a register block configured to store an individual computation coefficient, and
 the plurality of computing units is further configured to generate the first depth information based on the individual computation coefficient.

11. The distance measuring device according to claim 1, further comprising a common register block configured to store an individual computation coefficient set for each of the plurality of computing units.

12. The distance measuring device according to claim 1, further comprising:
 a first chip including the array; and
 a second chip including the read circuit and the plurality of computing units, wherein
  a stack chip comprises the first chip and the second chip laminated to the first chip, and
  in the second chip, the plurality of computing units is parallel with the read circuit.

13. The distance measuring device according to claim 12, wherein
 each of the plurality of computing units includes:
  a sampling circuit configured to:
   aggregate the detection signals read in a sampling period from the plurality of light-receiving elements, in units of pixels including at least one of the plurality of light-receiving elements; and
   generate pixel values of the pixels for each sampling period,
  a histogram circuit configured to generate, for each of the pixels, a histogram of the pixel values for the each sampling period,
  a filter circuit configured to remove a noise component from the histogram for the each of the pixels, and
  an echo detecting circuit configured to extract an optical component from the histogram from which the noise component is removed, and
 the each of the plurality of computing units comprises the sampling circuit, the histogram circuit, the filter circuit, and the echo detecting circuit in order of the sampling circuit, the histogram circuit, the filter circuit, and the echo detecting circuit, from a side close to the read circuit.

14. The distance measuring device according to claim 1, further comprising an optical system configured to scan the first angle of view in the array at specific intervals in a specific direction.

15. The distance measuring device according to claim 1, further comprising a light-emitting unit configured to output laser light having a specific wavelength at specific emission intervals, wherein each of the plurality of light-receiving elements is configured to detect reflected light of the laser light.

16. A vehicle-mounted system, comprising:

the distance measuring device according to claim 1;

an autonomous driving module configured to input the plurality of computation coefficients to the distance measuring device; and an engine control unit configured to transmit, to the autonomous driving module, information associated with at least one of vehicle driving or vehicle interior environment, wherein the autonomous driving module is further configured to change the plurality of computation coefficients based on the information associated with at least one of the vehicle driving or the vehicle interior environment.

17. A distance measuring method, comprising:

reading detection signals from each of a plurality of light-receiving elements, wherein the each of the plurality of light-receiving elements being configured to detect incidence of a photon; and generating depth information on a distance to an object present in an angle of view in different regions, based on the detection signals read from the each of the plurality of light-receiving elements associated with the different regions, and a plurality of computation coefficients, wherein each of the plurality of computation coefficients is at least partially different.

\* \* \* \* \*